United States Patent
Mizuno et al.

(10) Patent No.: US 8,863,659 B2
(45) Date of Patent: Oct. 21, 2014

(54) SCREEN PRINTING LINE AND SCREEN PRINTING METHOD

(75) Inventors: Manabu Mizuno, Chiryu (JP); Takeshi Kondo, Chiryu (JP); Mitsuaki Kato, Anjyo (JP)

(73) Assignee: Fuji Machine Mfg. Co., Ltd., Chiryu-Shi (JP)

( * ) Notice: Subject to any disclaimer, the term of this patent is extended or adjusted under 35 U.S.C. 154(b) by 0 days.

(21) Appl. No.: 13/643,567

(22) PCT Filed: Apr. 25, 2011

(86) PCT No.: PCT/JP2011/060071
§ 371 (c)(1),
(2), (4) Date: Nov. 9, 2012

(87) PCT Pub. No.: WO2011/136179
PCT Pub. Date: Nov. 3, 2011

(65) Prior Publication Data
US 2013/0055911 A1 Mar. 7, 2013

(30) Foreign Application Priority Data

Apr. 27, 2010 (JP) .................................. 2010-102298
May 12, 2010 (JP) .................................. 2010-110426
Nov. 1, 2010 (JP) .................................. 2010-245587

(51) Int. Cl.
*B05C 17/04* (2006.01)
*B41M 1/12* (2006.01)
*H05K 13/00* (2006.01)
*B41F 15/08* (2006.01)
*H05K 3/12* (2006.01)

(52) U.S. Cl.
CPC ............ *B41F 15/08* (2013.01); *H05K 13/0061* (2013.01); *H05K 3/1233* (2013.01)
USPC ......................................... 101/123; 101/129

(58) Field of Classification Search
CPC .. B41F 15/0818; B41F 15/0827; B41M 1/12; H05K 3/1225; H05K 3/1233
USPC .................. 101/114, 123, 124, 129, 479, 480
See application file for complete search history.

(56) References Cited

U.S. PATENT DOCUMENTS 4,073,232 A 2/1978 Brewer
5,452,656 A * 9/1995 Becher et al. ................. 101/126
(Continued)

FOREIGN PATENT DOCUMENTS

CN 1656866 A 8/2005
CN 1907706 A 2/2007
(Continued)

OTHER PUBLICATIONS

International Search Report issued in International Patent Application No. PCT/JP2011/060071 dated May 31, 2011.
(Continued)

*Primary Examiner* — Ren Yan
(74) *Attorney, Agent, or Firm* — Oliff PLC

(57) ABSTRACT

A screen printing line with higher utility is provided. In a screen printing line including a plurality of screen printing machines and a plurality of shuttle conveyors each provided between any adjacent two of the plurality of screen printing machines, each of the screen printing machines includes: a main body; a front conveyor having a substrate support device; a rear conveyor configured to allow passage of a circuit substrate; a printing device configured to carry out screen printing on the circuit substrate supported by the substrate support device. Also, each of the plurality of shuttle conveyors includes a movable conveyor movable between a position continuous to the front conveyor and a position continuous to the rear conveyor.

9 Claims, 13 Drawing Sheets

(56) References Cited

U.S. PATENT DOCUMENTS

| | | | |
|---|---|---|---|
| 6,058,835 A | 5/2000 | Isogai et al. | |
| 6,202,551 B1* | 3/2001 | Murakami | 101/123 |
| 8,196,287 B2* | 6/2012 | Awata et al. | 29/740 |
| 2002/0053132 A1 | 5/2002 | Hamasaki et al. | |
| 2002/0148374 A1 | 10/2002 | Peckham et al. | |
| 2005/0077143 A1 | 4/2005 | Hamasaki et al. | |
| 2005/0115060 A1 | 6/2005 | Kondo | |
| 2009/0277348 A1* | 11/2009 | Abe et al. | 101/126 |
| 2010/0126363 A1 | 5/2010 | Mizuno et al. | |
| 2010/0133064 A1 | 6/2010 | Kondo | |
| 2011/0017080 A1* | 1/2011 | Miyahara et al. | 101/123 |
| 2011/0180588 A1 | 7/2011 | Nagao | |
| 2011/0197437 A1 | 8/2011 | Nagao | |
| 2011/0197775 A1* | 8/2011 | Nagao | 101/126 |
| 2012/0085254 A1 | 4/2012 | Nagao | |
| 2012/0090484 A1 | 4/2012 | Miyahara et al. | |
| 2012/0201587 A1 | 8/2012 | Kato et al. | |

FOREIGN PATENT DOCUMENTS

| | | |
|---|---|---|
| CN | 1942059 A | 4/2007 |
| CN | 101032880 A | 9/2007 |
| CN | 101686635 A | 3/2010 |
| JP | A-62-84871 | 4/1987 |
| JP | S62-200430 | 12/1987 |
| JP | 02-207590 | 8/1990 |
| JP | 04-129630 | 4/1992 |
| JP | A-4-331151 | 11/1992 |
| JP | A-07-241977 | 9/1995 |
| JP | 10-044371 | 2/1998 |
| JP | 10-058649 | 3/1998 |
| JP | A-2000-263749 | 9/2000 |
| JP | A-2001-150631 | 6/2001 |
| JP | A-2001-326497 | 11/2001 |
| JP | A-2002-036695 | 2/2002 |
| JP | A-2002-240239 | 8/2002 |
| JP | A-2003-170564 | 6/2003 |
| JP | A-2004-104075 | 4/2004 |
| JP | 2004-142299 | 5/2004 |
| JP | 2005081745 A * | 3/2005 |
| JP | 2006-001057 | 1/2006 |
| JP | A-2006-69011 | 3/2006 |
| JP | 2006-321106 | 11/2006 |
| JP | A-2007-15307 | 1/2007 |
| JP | A-2007-38456 | 2/2007 |
| JP | A-2007-125757 | 5/2007 |
| JP | A-2009-252808 | 10/2009 |
| JP | 2010-087449 A | 4/2010 |
| JP | 2010-087450 A | 4/2010 |
| WO | WO 2009035136 A1 | 3/2009 |
| WO | WO 2009150906 A1 | 12/2009 |

OTHER PUBLICATIONS

Apr. 22, 2014 Notification of Reason for Refusal issued in Japanese Patent Application No. 2010-110426 (with English Translation).
Dec. 20, 2012 International Preliminary Report on Patentability issued in International Patent Application No. PCT/JP2011/060071 (with English Translation).
Feb. 18, 2014 Office Action issued in Japanese Patent Application No. 2010-102298 (with translation).
Office Action issued in Chinese Patent Application No. 201180021130.8 dated Dec. 4, 2013 (with translation).
International Preliminary Report on Patentability issued in International Patent Application No. PCT/JP2011/060072 dated Dec. 10, 2012.
International Preliminary Report on Patentability issued in International Patent Application No. PCT/JP2011/060070 dated Dec. 10, 2012.
Chinese Office Action in Application No. 201180020686.5 mailed Dec. 2, 2013 (with English Translation).
Chinese Office Action in Application No. 2011800206884.4 mailed Dec. 3, 2013 (with English Translation).
U.S. Office Action in U.S. Appl. No. 13/643,554 mailed Feb. 27, 2014.
Jun. 18, 2014 Office Action issued in U.S. Appl. No. 13/643,777.
Jul. 29, 2014 Notification of Second Office Action issued in Chinese Patent Application No. 201180020686.5 (with English Translation).
Aug. 12, 2014 Notification of Reason for Refusal issued in Japanese Patent Application No. 2010-245587 (with English Translation).
Aug. 12, 2014 Notification of Reason for Refusal issued in Japanese Patent Application No. 2010-110426 (with English Translation).

* cited by examiner

SCREEN PRINTING LINE AND SCREEN PRINTING METHOD

TECHNICAL FIELD

The present invention relates to a screen printing line including a plurality of screen printing machines and to a screen printing method performed by the screen printing line.

BACKGROUND ART

As disclosed in Patent Document 1 below, a screen printing machine includes a printing device and a substrate support device, and a circuit substrate is loaded into the screen printing machine in which a printable material is printed. After the printing, the circuit substrate is unloaded from the screen printing machine and supplied to a substrate working machine that carries out working operations on the circuit substrate.

PRIOR ART DOCUMENTS

Patent Documents

Patent Document 1: JP-A-2007-15307

SUMMARY OF THE INVENTION

Problem to be Solved by the Invention

In recent years, however, a situation occurs in which supply of the circuit substrate from the screen printing machine to the substrate working machine is too late. For example, a cycle time to mount electronic circuit components on the circuit substrate has been shortened in an electronic-circuit-component mounting line including a plurality of electronic-circuit-component mounting machines each as one kind of the substrate working machine, and when the cycle time becomes shorter than a cycle time to print the printable material on the circuit substrate, the supply of the circuit substrate becomes too late.

The inventors of the present application have considered that two screen printing machines are provided in a single electronic-circuit-component mounting line. In this line, each of the screen printing machines includes two conveyors respectively in a front portion and a rear portion of the screen printing machine, and one of the screen printing machines includes a substrate support device in the conveyor provided in the front portion while the other of the screen printing machines includes a substrate support device in the conveyor provided in the rear portion. The two screen printing machines are provided such that the front conveyors are continuous to each other and the rear conveyors are also continuous to each other. The circuit substrate supplied to the conveyor provided with the substrate support device in an upstream one of the screen printing machines in a circuit-substrate conveying direction is printed with the printable material by the printing device while being supported on the substrate support device. The circuit substrate is then supplied to the electronic-circuit-component mounting line by being conveyed by the conveyor not provided with the substrate support device in a downstream one of the screen printing machines. Also, the circuit substrate supplied to the conveyor not provided with the substrate support device in the upstream screen printing machine is conveyed through the printing device and loaded onto the conveyor provided with the substrate support device in the downstream screen printing machine. After being printed with the printable material, the circuit substrate is supplied to the electronic-circuit-component mounting line. Where the screen printing line is thus constructed with the two screen printing machines, it is possible to shorten a cycle time to supply the circuit substrate to the substrate working line. In actual use, however, it has been found that there is still room for improvements.

The present invention has been developed in view of the above-described situations, and it is an object of the present invention to provide a screen printing line and a screen printing method with higher utility.

Means for Solving Problem

The present invention may provide a screen printing line comprising: (A) a plurality of screen printing machines arranged in a right and left direction and each configured to carry out screen printing on a circuit substrate; and (B) at least one shuttle conveyor each provided between any pair of the adjacent screen printing machines of the plurality of screen printing machines, the adjacent screen printing machines being adjacent to each other, the at least one shuttle conveyor each being configured to receive and pass the circuit substrate, wherein each of the plurality of screen printing machines comprises: (a) a front conveyor including a substrate support device and provided in a front portion of the screen printing machine; (b) a rear conveyor provided in a rear portion of the screen printing machine and configured to allow passage of the circuit substrate; and (c) a printing device configured to carry out the screen printing on the circuit substrate supported by the substrate support device, and wherein each of the at least one shuttle conveyor includes a movable conveyor that is movable at least between a position continuous to at least one of the front conveyors of the adjacent screen printing machines and a position continuous to at least one of the rear conveyors of the adjacent screen printing machines.

The present invention may also provide a screen printing line comprising: (A) a plurality of screen printing machines arranged in a right and left direction and each configured to carry out screen printing on a circuit substrate; and (B) a plurality of shuttle conveyors each configured to convey the circuit substrate and each placed on one of upstream and downstream sides of any of the plurality of screen printing machines, wherein each of the plurality of screen printing machines comprises: (a) a main body; (b) a front conveyor including a substrate support device and provided in a front portion of the main body; (c) a rear conveyor provided in a rear portion of the main body and configured to allow passage of the circuit substrate; and (d) a printing device configured to carry out the screen printing on the circuit substrate supported by the substrate support device, wherein each of the plurality of shuttle conveyors includes a movable conveyor that is movable at least between a position continuous to the front conveyor of a corresponding one of the plurality of screen printing machines and a position continuous to the rear conveyor of the corresponding one of the plurality of screen printing machines, and wherein at least one of one of the plurality of screen printing machines and one of the plurality of shuttle conveyors comprises a substrate identification device configured to identify at least a type of the circuit substrate, and the screen printing line comprises an operating-manner determining portion configured to, based on a result of the identification of the substrate identification device, determine an operating manner of at least one of the screen printing machines and the shuttle conveyors.

The present invention may also provide a screen printing method performed by a screen printing line, the screen printing line comprising: (A) two screen printing machines arranged in a right and left direction and each configured to carry out screen printing on a circuit substrate; and (B) a shuttle conveyor provided between the two screen printing machines to receive and pass the circuit substrate, wherein each of two screen printing machines comprises: (a) a front conveyor including a substrate support device and provided in a front portion of the screen printing machine; (b) a rear conveyor provided in a rear portion of the screen printing machine and configured to allow passage of the circuit substrate; and (c) a printing device configured to carry out the screen printing on the circuit substrate supported by the substrate support device, wherein the shuttle conveyor includes a movable conveyor that is movable at least between a position continuous to at least one of the front conveyors of the two screen printing machines and a position continuous to at least one of the rear conveyors of the two screen printing machines, and wherein the screen printing method comprises: mounting masks respectively on the two screen printing machines, the masks being identical to each other; and having the two screen printing machines respectively carry out the printing in parallel on the same sides of circuit substrates each having the same model number.

The present invention may also provide another screen printing method performed by the screen printing line comprising the two screen printing machines and the shuttle conveyor provided therebetween, wherein the screen printing method comprises: mounting masks respectively on the two screen printing machines, the masks being different from each other; and having the two screen printing machines respectively carry out the printing in parallel on circuit substrates having different model numbers from each other or on a front side and a back side of circuit substrates each having the same model number.

The present invention may also provide a screen printing method performed by a screen printing line comprising, instead of the two screen printing machines and the shuttle conveyor provided therebetween, three screen printing machines and two shuttle conveyors each provided between any adjacent two of the three screen printing machines, wherein the screen printing method comprises: mounting masks respectively on the three screen printing machines, the masks being different from one another; and having the three screen printing machines respectively carry out the printing in parallel on three types of circuit substrates having different model numbers from one another.

The present invention may also provide a screen printing method performed by a screen printing line comprising, instead of the two screen printing machines and the shuttle conveyor provided therebetween, four screen printing machines and three shuttle conveyors each provided between any adjacent two of the four screen printing machines, wherein the screen printing method comprises: mounting two identical masks respectively on two of the four screen printing machines as one pair, and mounting two identical masks respectively on the other two of the four screen printing machines as the other pair; and having the two screen printing machines of each of the one pair and the other pair respectively carry out the printing in parallel on circuit substrates having different model numbers from each other or on a front side and a back side of circuit substrates each having the same model number.

Effect of the Invention

In the screen printing line constructed as described above, the substrate support device is provided in the front conveyor of each of the screen printing machines in which the printing is carried out, and the at least one shuttle conveyor is each provided between any pair of the adjacent screen printing machines. Thus, the screen printing line can be configured such that the circuit substrate having been printed by an upstream one of the screen printing machines is conveyed by a rear conveyor of a downstream one of the screen printing machines through the downstream screen printing machine while the circuit substrate having not been printed is loaded onto a front conveyor of the downstream screen printing machine and a printable material is printed on the circuit substrate. As a result, the plurality of screen printing machines can carry out the printings in parallel. In addition, since the substrate support device and the printing device are provided in the front portion of each of the screen printing machines, an operator can easily access these devices and easily perform working operations such as a changeover, cleaning, and replenishment of the printable material.

Also, in the above-described screen printing line including the screen printing machines, the shuttle conveyor(s), the substrate identification device(s), and the operating-manner determining portion, the operating manner of at least one of the screen printing machines and the shuttle conveyors can be determined based on the identification of the type of the circuit substrate. Thus, it is possible to reliably prevent at least one of that the printing is carried out on a wrong circuit substrate and that the movable conveyor of the shuttle conveyor is moved to an inappropriate position. For example, even where an order of the circuit substrates conveyed through the printing line has been changed from a planned one by the operator having taken or inserted a circuit substrate or circuit substrates in the middle of the printing line, it is possible to reliably prevent at least one of that the printing is carried out on a wrong circuit substrate and that the movable conveyor of the shuttle conveyor is moved to an inappropriate position

FORMS OF THE INVENTION

There will be described by way of examples forms of inventions recognized to be claimable by the present applicant. The inventions may be hereinafter referred to as "claimable inventions", and include the invention as defined in the appended claims (which may be referred to as "the invention" or "the invention of the present application"), an invention of a concept subordinate or superordinate to the concept of the invention of the present application, and/or an invention of a concept different from the concept of the invention of the present application. The forms are numbered like the appended claims and depend on another form or forms, where appropriate. This is for easier understanding of the claimable invention, and it is to be understood that combinations of constituent elements that constitute the claimable inventions are not limited to those of the following forms. That is, the claimable inventions are to be construed by taking account of the description following each form, the description of the embodiments, the related art, the common general technical knowledge, and others, and as long as the claimable inventions are constructed in this way, any form in which one or more elements are added to or deleted from any one of the following forms may be considered as one form of the claimable invention.

(1) A screen printing line, comprising:
a plurality of screen printing machines arranged in a right and left direction and each configured to carry out screen printing on a circuit substrate; and at least one shuttle conveyor each provided between any pair of the adjacent screen printing machines of the plurality of screen printing machines, the adjacent screen printing machines being adjacent to each other, the at least one shuttle conveyor each being configured to receive and pass the circuit substrate, wherein each of the plurality of screen printing machines comprises:

a front conveyor including a substrate support device and provided in a front portion of the screen printing machine;

a rear conveyor provided in a rear portion of the screen printing machine and configured to allow passage of the circuit substrate; and a printing device configured to carry out the screen printing on the circuit substrate supported by the substrate support device, and wherein each of the at least one shuttle conveyor includes a movable conveyor that is movable at least between a position continuous to at least one of the front conveyors of the adjacent screen printing machines and a position continuous to at least one of the rear conveyors of the adjacent screen printing machines.

In the screen printing line according to the present form, the substrate support device is provided in the front conveyor of each of the screen printing machines in which the printing is carried out, and the at least one shuttle conveyor is each provided between any pair of the adjacent screen printing machines. Thus, the screen printing line can be configured such that the circuit substrate having been printed by an upstream one of the screen printing machines is conveyed by a rear conveyor of a downstream one of the screen printing machines through the downstream screen printing machine while the circuit substrate having not been printed is loaded onto a front conveyor of the downstream screen printing machine and a printable material is printed on the circuit substrate. As a result, the plurality of screen printing machines can carry out the printings in parallel. Therefore, in the screen printing line according to the present invention, the plurality of screen printing machines can carry out the printings in parallel, and in addition since the substrate support device and the printing device are provided in the front portion of each of the screen printing machines, an operator can easily access these devices and easily perform working operations such as a changeover, cleaning, and replenishment of the printable material.

(2) The screen printing line according to the above form (1), the plurality of screen printing machines are two screen printing machines.

It is possible to effectively obtain the effects in the form (1) with a simple construction. For example, printings of the same type or different types can be carried out in parallel as needed, thereby obtaining at least one of effects: (a) improved printing efficiency; (b) enabling supply of different types of circuit substrates having been printed with printable materials; and (c) avoidance of interrupting the substrate supply from the screen printing machine due to an interruption of the printing.

(3) The screen printing line according to the above form (1), wherein the plurality of screen printing machines are three screen printing machines, and the at least one shuttle conveyor is arranged such that one shuttle conveyor is provided between each pair of the adjacent screen printing machines of the three screen printing machines.

The larger the number of the screen printing machines, the easier efficiency of the supply is improved greatly and variety of printing manners is increased.

(4) The screen printing line according to the above form (1), wherein the plurality of screen printing machines are four screen printing machines, and the at least one shuttle conveyor is arranged such that one shuttle conveyor is provided between each pair of the adjacent screen printing machines of the four screen printing machines.

(5) The screen printing line according to any one of the above forms (1) through (4), wherein the at least one shuttle conveyor is a plurality of shuttle conveyors, and wherein at least one of the plurality of shuttle conveyors is provided upstream of a most upstream screen printing machine that is located at the most upstream position among the plurality of screen printing machines.

The circuit substrate can be supplied selectively to the front conveyor and the rear conveyor of the most upstream screen printing machine.

(6) The screen printing line according to any one of the above forms (1) through (5), wherein the at least one shuttle conveyor is a plurality of shuttle conveyors, and wherein at least one of the plurality of shuttle conveyors is provided downstream of a most downstream screen printing machine that is located at the most downstream position among the plurality of screen printing machines.

It is effective not only in a case in which the machine disposed downstream of the screen printing line includes only a single lane of a conveyor, but also in a case in which, where the machine disposed downstream of the screen printing line includes two lanes of the front conveyor and the rear conveyor, a position of at least one of these conveyors in a front and rear direction is different from a position of at least one of the front conveyor and the rear conveyor of the screen printing machine in the front and rear direction. The shuttle conveyor is preferably configured such that the movable conveyor is movable to all positions corresponding to the front and rear conveyors of the most downstream screen printing machine and the front and rear conveyors of the machine disposed downstream of the screen printing line.

(7) The screen printing line according to any one of the above forms (1) through (6), wherein each of the at least one shuttle conveyor has a configuration capable of moving the movable conveyor to a more forward position than a position at which the circuit substrate is passed and received between the movable conveyor and the front conveyor.

Located near the movable conveyor, the operator can perform the working operations on the movable conveyor, which facilitates the working operations. The working operations on the movable conveyor include: inspection of a printed state of the circuit substrate; extraction of the circuit substrate; and maintenance and inspection of the movable conveyor.

(8) The screen printing line according to any one of the above forms (1) through (7), the front conveyor includes (a) a main conveyor including the substrate support device and (b) at least one of: an in-conveyor provided upstream of the main conveyor and configured to load the circuit substrate onto the screen printing machine; and an outconveyor provided downstream of the main conveyor and configured to unload the circuit substrate from the screen printing machine.

When the in-conveyor conveys the circuit substrate to a position near the substrate support device of the front conveyor and the printing becomes ready, the circuit substrate can be immediately loaded onto and supported by the substrate support device to perform the printing. Also, it is possible to have the printed circuit substrate to stay on the outconveyor to wait for unloading. As a result, it is possible to shorten a length of time required for the loading and unloading of the circuit substrate, which improves an operating rate of the screen printing machine.

(9) The screen printing line according to the above form (8), wherein at least one of the in-conveyor and the outconveyor includes (a) a stopper plate whose longitudinal direction coincides with a conveyor-width direction of the at least one of the in-conveyor and the outconveyor and (b) a stopper-plate moving device configured to move the stopper plate selectively to one of: an operative position at which the stopper plate is capable of contacting the circuit substrate by being positioned in a conveyance path of the at least one of the in-conveyor and the outconveyor; and a retracted position at which the stopper plate allows passage of the circuit substrate by being retracted from the conveyance path.

There is usually no problem if accuracy of a stop position of the circuit substrate is lower in each of the in-conveyor and the outconveyor than in the main conveyor. Thus, the circuit substrate can be made so as to be held in contact, at its relatively long portion in the conveyor-width direction, with the stopper plate such that the stopper plate stably stops the circuit substrate, or a need to adjust the stopper device can be eliminated even in a case where a downstream edge of the circuit substrate in the conveying direction is not a simple straight line.

The feature in the present form can be employed independently of the feature in any of the forms (1) through (7).

(10) The screen printing line according to the above form (9), wherein at least one of the in-conveyor and the outconveyor is configured to allow the circuit substrate to project in an upstream direction of the screen printing line from an upstream end of the at least one of the in-conveyor and the outconveyor in a state in which the circuit substrate is held in contact with the stopper plate.

The at least one of the in-conveyor and the outconveyor can be constructed compactly in the conveying direction.

(11) A screen printing method performed by the screen printing line according to the above form (2), the screen printing method comprising:
mounting masks respectively on the two screen printing machines, the masks being identical to each other; and
having the two screen printing machines respectively carry out the printing in parallel on the same sides of circuit substrates each having the same model number.

In the method according to the present form, it is possible to reduce by half a cycle time for one of front and back faces of the circuit substrate. Also, even where the printing is interrupted in one of the screen printing machines, the printing can be carried out in the other of the screen printing machines. Thus, supply of the circuit substrate having been printed with the printable material on one of the front and back faces to a next process is not interrupted, and working operations in the next process are not interrupted.

(12) A screen printing method performed by the screen printing line according to the above form (2), the screen printing method comprising:
mounting masks respectively on the two screen printing machines, the masks being different from each other; and
having the two screen printing machines respectively carry out the printing in parallel on circuit substrates having different model numbers from each other or on a front side and a back side of circuit substrates each having the same model number.

The two types of the circuit substrates having the different model numbers with the printable materials printed thereon are obtained in parallel, and the circuit substrates having the same model number with the printable materials printed respectively on the front face and the back face are obtained in parallel. Thus, where the electronic circuit components are mounted on the circuit substrate having been printed with the printable material, it is possible to successively obtain the circuit substrates of different types with the electronic circuit components mounted thereon. Alternatively, mounting of the electronic circuit components on the back face can be carried out without waiting for mounting of the electronic circuit components on the front faces of all the circuit substrates of the predetermined number. This makes it possible to speedily obtain the circuit substrates with the electronic circuit components mounted on their front and back faces.

(13) A screen printing method performed by the screen printing line according to the above form (3), the screen printing method comprising:
mounting masks respectively on the three screen printing machines, the masks being different from one another; and
having the three screen printing machines respectively carry out the printing in parallel on three types of circuit substrates having different model numbers from one another.

The printable materials can be printed on the three types of circuit substrates having the different model numbers from one another.

(14) A screen printing method performed by the screen printing line according to the above form (4), the screen printing method comprising:
mounting two identical masks respectively on two of the four screen printing machines as one pair, and mounting two identical masks respectively on the other two of the four screen printing machines as the other pair; and
having the two screen printing machines of each of the one pair and the other pair respectively carry out the printing in parallel on circuit substrates having different model numbers from each other or on a front side and a back side of circuit substrates each having the same model number.

A throughput of the screen printing line, e.g., the number of circuit substrates which can be printed in the screen printing line per unit time can be twice as much as that of the screen printing line that performs the screen printing method according to the form (12), thereby improving the operating rate of the electronic-circuit-component mounting line such as a downstream electronic-circuit-component mounting line. Also, as long as the printings of the two screen printing machines for the same printing are not interrupted at the same time, two types of the circuit substrates having been printed in different manners can be necessarily obtained, leading to a lower possibility of waiting for supply of the circuit substrate of one of the two types in the next process.

(15) A screen printing line, comprising:
a screen printing machine comprising:
a main body;
a front conveyor including a substrate support device and provided in a front portion of the main body;
a rear conveyor provided in a rear portion of the main body and configured to allow passage of the circuit substrate; and
a printing device configured to carry out screen printing on the circuit substrate supported by the substrate support device;
a shuttle conveyor placed on one of upstream and downstream sides of the screen printing machine and including a movable conveyor that is movable between a position continuous to the front conveyor of the screen printing machine and a position continuous to the rear conveyor of the screen printing machine;
a substrate identification device provided at least one of the screen printing machine and the shuttle conveyor and configured to identify at least a type of the circuit substrate; and an operating-manner determining portion configured to, based on a result of the identification of the substrate identification device, determine an operating manner of at least one of the screen printing machine and the shuttle conveyor.

The substrate identification device is preferably provided at least on one of the screen printing machine and the shuttle conveyor, which one is located upstream of the other. Where the shuttle conveyor is placed on the upstream side, the operating-manner determining portion is configured to at least determine whether the movable conveyor of the shuttle conveyor is to be moved to the position continuous to the front conveyor of the screen printing machine or the position continuous to the rear conveyor. On the other hand, where the screen printing machine is placed on the upstream side, the operating-manner determining portion is configured to at least determine whether the screen printing machine is to carry out the printing on the circuit substrate. A case where the substrate identification device is provided in each of the screen printing machine and the shuttle conveyor will be described later.

As the substrate identification device, there may be employed, for example, an optical reading device for reading an identification code placed on the circuit substrate such as a bar code and a two-dimensional code, and a recognizing device of a communication type such as an RFID (Radio Frequency Identification) tag reader/writer configured to communicate with an RFID tag attached on the circuit substrate to obtain the identification code of the circuit substrate. The identification code may include: a code which represents a type of the circuit substrate; and a code which allows the device to identify not only the type but also the individual circuit substrate.

The screen printing line according to the present form can be used alone or as one element of a screen printing line below. In any case, since the operating manner of the at least one of the screen printing machine and the shuttle conveyor is determined based on the identification of the type of the circuit substrate, it is possible to reliably prevent that the printing is carried out on a wrong circuit substrate and that the movable conveyor is moved to the position continuous to an inappropriate one of the front conveyor and the rear conveyor.

(16) A screen printing line, comprising:
a plurality of screen printing machines arranged in a right and left direction and each configured to carry out screen printing on a circuit substrate; and
a plurality of shuttle conveyors each configured to convey the circuit substrate and each placed on one of upstream and downstream sides of any of the plurality of screen printing machines,
wherein each of the plurality of screen printing machines comprises:
a main body;
a front conveyor including a substrate support device and provided in a front portion of the main body;
a rear conveyor provided in a rear portion of the main body and configured to allow passage of the circuit substrate; and
a printing device configured to carry out the screen printing on the circuit substrate supported by the substrate support device,
wherein each of the plurality of shuttle conveyors includes a movable conveyor that is movable at least between a position continuous to the front conveyor of a corresponding one of the plurality of screen printing machines and a position continuous to the rear conveyor of the corresponding one of the plurality of screen printing machines, and wherein at least one of one of the plurality of screen printing machines; and one of the plurality of shuttle conveyors comprises a substrate identification device configured to identify at least a type of the circuit substrate, and the screen printing line comprises an operating-manner determining portion configured to, based on a result of the identification of the substrate identification device, determine an operating manner of at least one of the screen printing machines and the shuttle conveyors.

The features in the above forms (2) through (10) can also be applied to the screen printing line according to the present form (16) through the form (21) below.

(17) The screen printing line according to the above form (16),
wherein the screen printing line comprises:
a plurality of control computers configured to respectively control the plurality of screen printing machines; and
a host computer connected to the control computers,
wherein the substrate identification device is provided in each of the plurality of shuttle conveyors and connected to the host computer, and
wherein the host computer comprises the operating-manner determining portion and is configured to command the control computers to operate the screen printing machines in the operating manner determined by the operating-manner determining portion.

The control computers may be configured to also control the shuttle conveyors. In this case, the control computer can be configured to, based on the command of the host computer, control the shuttle conveyors to be operated in the operating manner determined by the operating-manner determining portion.

(18) The screen printing line according to the above form (16),
wherein the substrate identification device is provided in each of the plurality of shuttle conveyors, the plurality of shuttle conveyors each being placed on an upstream side of any of the plurality of screen printing machines, and
wherein the operating-manner determining portion is configured to, based on the result of the identification of each of the substrate identification devices, determine whether each of the movable conveyors is to be moved to a position continuous to the front conveyor of a corresponding one of the screen printing machines which is disposed downstream of the movable conveyor, or a position continuous to the rear conveyor of the corresponding one of the screen printing machines which is disposed downstream of the movable conveyor.

Where the printing is necessarily carried out on the circuit substrate supplied to the front conveyor, determining whether the movable conveyor is to be moved to the position continuous to the front conveyor of the screen printing machine or the position continuous to the rear conveyor means determining whether the printing is to be carried out by the downstream screen printing machine.

(19) The screen printing line according to the above form (16),
wherein the screen printing line comprises:
a plurality of control computers configured to respectively control the plurality of screen printing machines,
wherein the substrate identification device is provided in the front conveyor of each of the plurality of screen printing machines, and
wherein the operating-manner determining portion is provided in each of the plurality of control computers and configured to determine whether the screen printing machine corresponding to the control computer is to carry out the printing on the circuit substrate identified by the substrate identification device.

The substrate identification device is provided in the front conveyor of each of the screen printing machines. Thus, even where the circuit substrate is taken or inserted in the middle of the screen printing line, wrong printing can be prevented.

Also, the screen printing machine is usually equipped with a fiducial-mark recognizing device that recognizes a fiducial mark of the circuit substrate. Thus, use of the fiducial-mark recognizing device as the substrate identification device leads to reduction in cost of the device. Alternately, even where the substrate identification device is provided independently of the fiducial-mark recognizing device, use of a device for moving the fiducial-mark recognizing device as a device for moving the substrate identification device leads to reduction in cost of the device.

(20) The screen printing line according to the above form (16), wherein the substrate identification device is provided in both of each of the plurality of shuttle conveyors and each of the plurality of screen printing machines, and wherein the operating-manner determining portion comprises:

a moving-position determining portion configured to, based on the result of the identification of the substrate identification device provided in each of the plurality of shuttle conveyors, determine whether the movable conveyor of the shuttle conveyor is to be moved to the position continuous to the front conveyor of the screen printing machine located downstream of the shuttle conveyor or the position continuous to the rear conveyor of the screen printing machine located downstream of the shuttle conveyor; and a printing determining portion configured to, based on the result of the identification of the substrate identification device provided in each of the plurality of screen printing machines, determine whether the circuit substrate identified by the substrate identification device is to be printed by the screen printing machine provided with the substrate identification device.

The construction in the present form can prevent wrong transfer of the circuit substrate to the front conveyor and the rear conveyor and prevent wrong printing even where the circuit substrate is taken or inserted after the identification of the circuit substrate in the shuttle conveyor.

(21) A screen printing line, comprising:

a plurality of screen printing machines arranged in a right and left direction and each configured to carry out screen printing on a circuit substrate; and at least one shuttle conveyor each provided between any adjacent two of the plurality of screen printing machines to receive the circuit substrate from an upstream one of the screen printing machines and pass the circuit substrate to a downstream one of the screen printing machines, wherein each of the plurality of screen printing machines comprises:

a main body;

a front conveyor including a substrate support device and provided in a front portion of the main body;

a rear conveyor provided in a rear portion of the main body and configured to allow passage of the circuit substrate; and a printing device configured to carry out the screen printing on the circuit substrate supported by the substrate support device, and wherein the screen printing line comprises:

a plurality of substrate identification devices provided respectively on the plurality of screen printing machines to identify at least a type of the circuit substrate; and a printing determining portion configured to, based on results of the identification of the substrate identification devices, determine whether the circuit substrate identified by the substrate identification devices is to be printed by the screen printing machine provided with each of the substrate identification devices.

The construction of the present form can reliably prevent the wrong printing even where the circuit substrate is taken or inserted in the middle of the screen printing line.

It is noted that the screen printing method according to any one of the above forms (11) through (14) can also be performed using the screen printing line according to any one of the above forms (16) through (21).

Also, in the screen printing line according to any one of the above forms (16) through (21), each of the screen printing machines may be configured such that the substrate support device is provided in each of the front conveyor provided in the front portion of the main body and the rear conveyor provided in the rear portion of the main body, and include the printing device capable of carrying out the screen printing on the circuit substrate supported by the substrate support devices provided in both of the front and rear conveyors. In such a case, where the substrate identification device is provided in the screen printing machine, the substrate identification device is preferably provided in each of the two substrate support devices. As the printing device capable of carrying out the screen printing on the circuit substrates supported by the substrate support devices provided in both of the front and rear conveyors, there may be employed, for example, two printing devices respectively corresponding to both of the substrate support devices or one printing device that is movable to positions respectively corresponding to both of the substrate support devices.

Also, in the screen printing line according to any one of the above forms (16) through (21), the plurality of screen printing machines can be configured to include: a screen printing machine in which the substrate support device is provided in the front conveyor provided in the front portion of the main body; and a screen printing machine in which the substrate support device is provided in the rear conveyor provided in the rear portion of the main body.

BRIEF DESCRIPTION OF THE DRAWINGS

FIGS. 5A and 5B are side views each showing the in-conveyor, wherein FIG. 5A is a view showing a situation in which a stopper plate is located at a retracted position, and FIG. 5B is a view showing a situation in which the stopper plate is located at an operative position.

EMBODIMENT

Hereinafter, there will be described embodiments of the claimable invention by reference to the drawings. It is to be understood that the claimable invention is not limited to the embodiments described below, and may be otherwise embodied with various changes and modifications, such as those described in the foregoing "FORMS OF THE INVENTION", which may occur to those skilled in the art.

Figure 1:
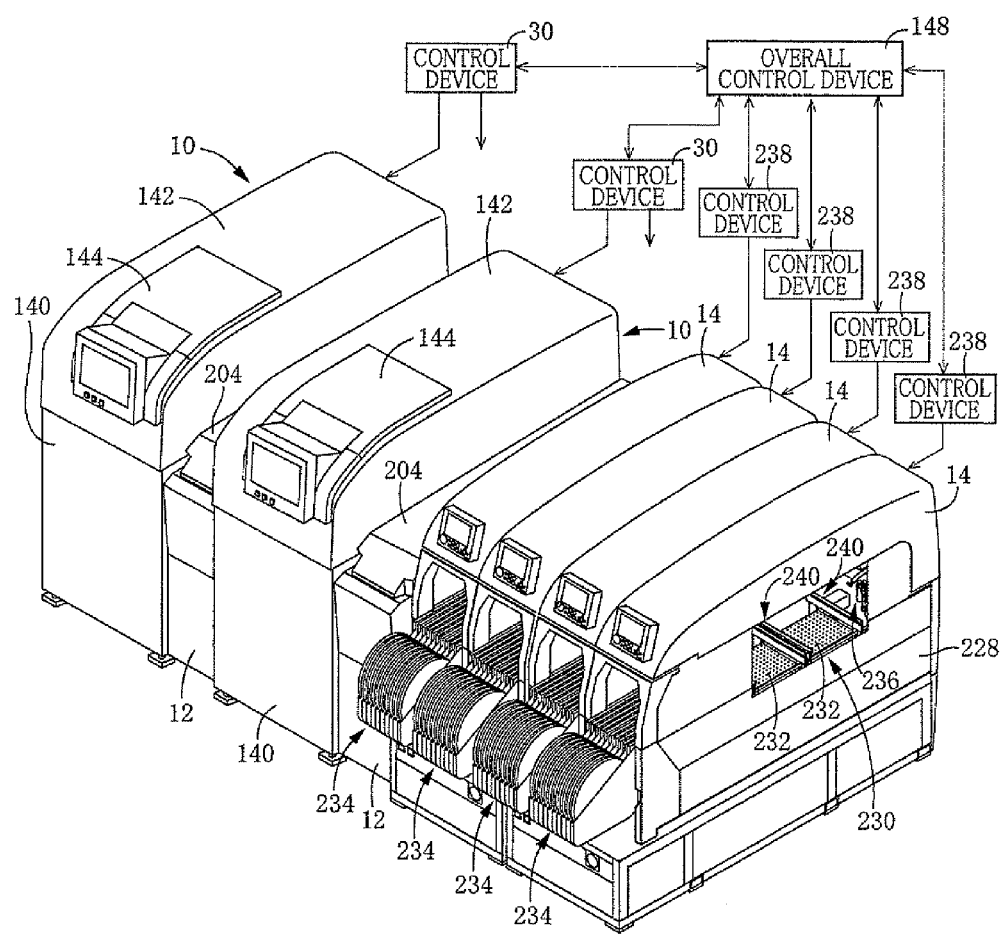
FIG. 1 is a perspective view showing an electronic-circuit assembly line that includes a screen printing line according to one embodiment of the claimable invention.

FIG. 1 shows an electronic-circuit assembly line that includes a screen printing line according to one embodiment of the claimable invention. The present electronic-circuit assembly line includes: a plurality of screen printing machines 10 (hereinafter simply referred to as "printer 10"), in the present embodiment, two printers 10; at least one shuttle conveyor 12, in the present embodiment, two shuttle conveyors 12; and at least one electronic-circuit-component mounting machine 14 (hereinafter simply referred to as "mounting machine 14"), in the present embodiment, a plurality of mounting machines 14, for example, four mounting machines 14. Each of the printers 10 and the mounting machines 14 is one kind of a substrate working machine configured to perform an operation for a circuit substrate, and the electronic-circuit assembly line is one kind of a substrate working line. The two printers 10 are located adjacent to and upstream of the four mounting machines 14 in a circuit-substrate conveying direction in which the circuit substrate is conveyed in the electronic-circuit assembly line. The two printers 10 are arranged side by side in a right and left direction parallel to the conveying direction. One of the two shuttle conveyors 12 is provided between the two printers 10, and the other of the two shuttle conveyors 12 is provided downstream of a downstream printer (a most downstream printer) of the two printers 10 and between the downstream printer 10 and one of the mounting machines 14 which is adjacent thereto. In the present embodiment, the right and left direction coincides with the circuit-substrate conveying direction, and a direction perpendicular to the conveying direction coincides with a front and rear direction. In the present embodiment, each of the right and left direction and the front and rear direction is horizontal.

The two pairs of the printers 10 and the shuttle conveyors 12 are similar in construction to each other, and an upstream one of the printers 10 and an upstream one of the shuttle conveyors 12 will be explained by way of example.

Figure 2:
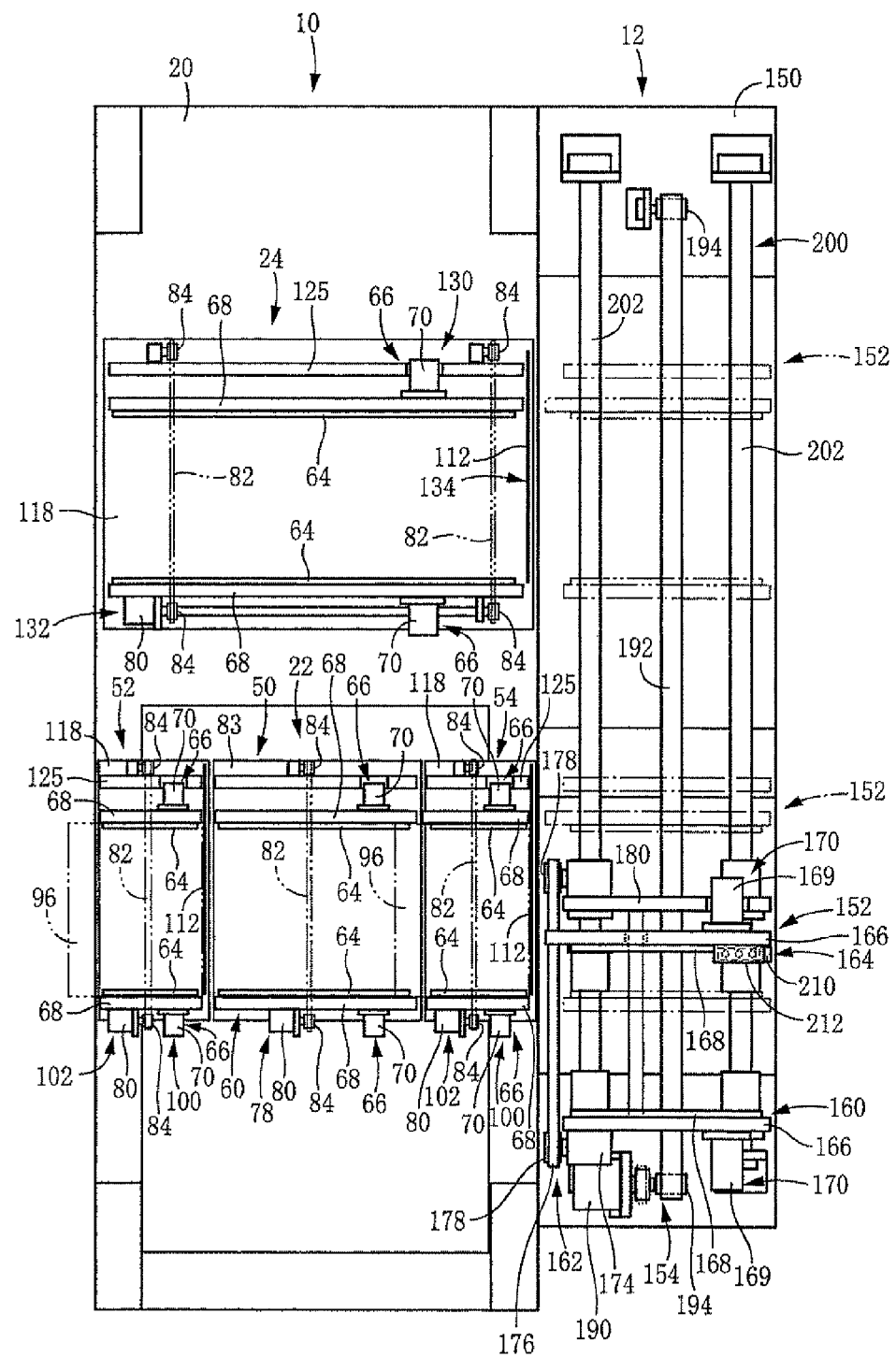
FIG. 2 is a plan view showing one of two pairs of screen printing machines and shuttle conveyors that constitute the screen printing line.
Figure 3:
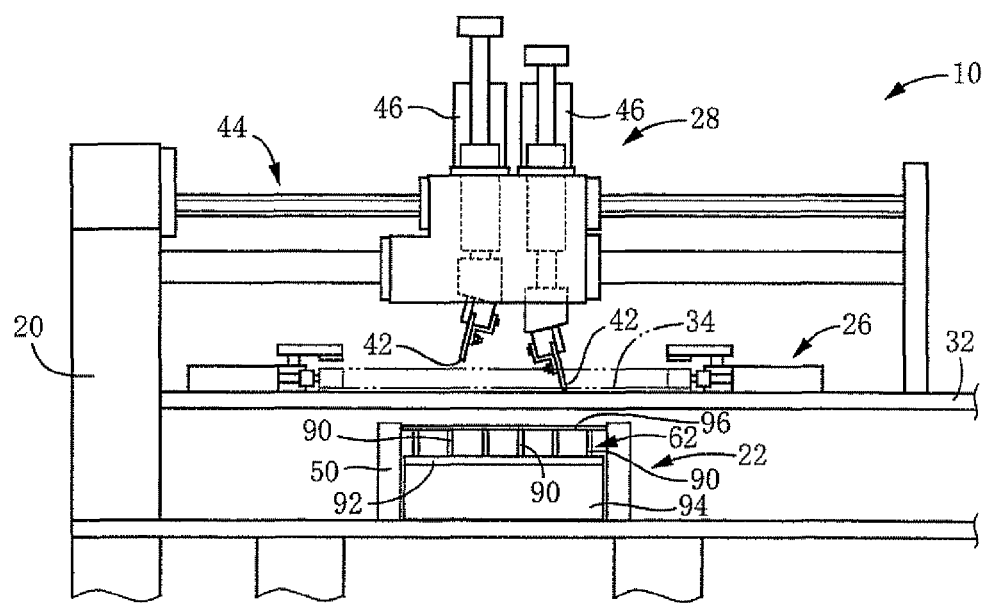
FIG. 3 is a side view showing the screen printing machine.

As shown in FIGS. 2 and 3, the printer 10 includes a printer main body 20, a front conveyor 22, a rear conveyor 24, a mask holding device 26, a printing device 28, and a control device 30. The mask holding device 26 is provided on an upper side of a main conveyor, which will be described below, of the front conveyor 22 of the printer main body 20 and holds a mask 34 placed on a mask support table 32 such that the mask 34 is in a horizontal attitude. The printing device 28 includes: a pair of squeegees 42; a squeegee moving device 44 configured to move the squeegees 42 in the front and rear direction along the mask 34; and squeegee elevating and lowering devices 46 each configured to elevate and lower a corresponding one of the squeegees 42 such that the squeegee 42 is brought into contact with and spaced apart from the mask 34. The printing device 28 is provided on an upper side of the mask holding device 26 of the printer main body 20.

As shown in FIG. 2, the front conveyor 22 is provided on a front portion of the printer main body 20, and the rear conveyor 24 is provided on a rear portion of the printer main body 20. The front conveyor 22 includes: the main conveyor 50; an in-conveyor 52 provided upstream of the main conveyor 50 in the conveying direction; and an outconveyor 54 provided downstream of the main conveyor 50. The main conveyor 50 includes a conveyor device 60 and a substrate support device 62. The conveyor device 60 is constituted by a belt conveyor in the present embodiment and includes: a pair of conveyor belts 64 and belt rotating devices 66 respectively for rotating the conveyor belts 64. The pair of conveyor belts 64 are rotatably supported by side frames 68, respectively. The conveyor belts 64 are rotated synchronously with each other by the respective belt rotating devices 66 each including a rotation motor 70 as a drive source. These rotations cause the circuit substrate to be conveyed with its printing surface being horizontal.

One of the pair of side frames 68 (a lower side frame 68 in FIG. 2) is a fixed side frame 68 provided unmovably, and the other of the pair of side frames 68 is a movable side frame 68 that is moved by a conveyor-width changing device 78 so as to be brought into contact with and spaced apart from the fixed side frame 68. As shown in FIG. 2, the conveyor-width changing device 78 includes: a width changing motor 80 as a drive source; a belt 82 to which the movable side frame 68 is connected; and pulleys 84 respectively mounted on the fixed side frame 68 and a main body 83 of the main conveyor 50, with the belt 82 being looped over the pulleys 84. The belt 82 is a timing belt, and each of the pulleys 84 is a timing pulley. When one of the pulleys 84 is rotated by the width changing motor 80, the belt 82 is rotated, and thereby the movable side frame 68 is moved while being guided by a guiding device, not shown. As a result, a distance between the pair of side frames 68 is changed, whereby a conveyor width is automatically changed.

In the present embodiment, the substrate support device 62, as schematically shown in FIG. 3, includes: a plurality of support pins 90 each as a support member; a pin support table 92; and a support-table elevating and lowering device 94, and the substrate support device 62 supports a circuit substrate 96 from a lower side thereof. Also, in the present embodiment, the substrate support device 62 cooperates with the conveyor device 60 to constitute a substrate clamping device. When the main conveyor 50 is elevated and lowered by an elevating and lowering device, not shown, the circuit substrate 96 is brought into contact with and spaced apart from a lower face of the mask 34. Furthermore, though not shown, a stopper device is provided on the main conveyor 50. This stopper device includes a stopper member and a stopper-member moving device that moves the stopper member to any position in a horizontal plane. When being positioned at a predetermined position, the stopper member can contact a downstream end of the circuit substrate to stop its movement.

Figure 4:
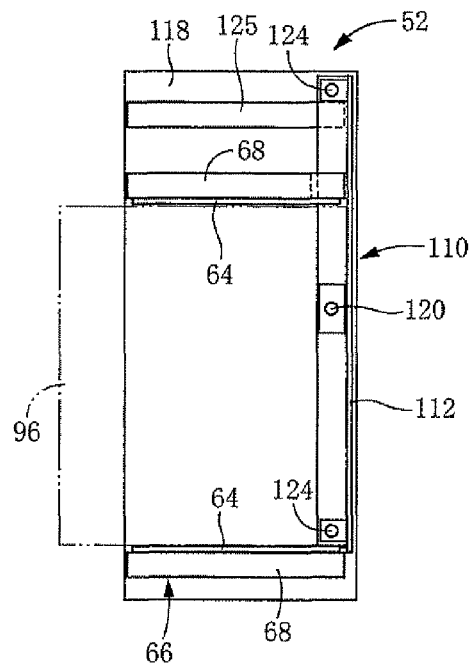
FIG. 4 is a plan view schematically showing an in-conveyor of the screen printing machine.

As shown in FIG. 2, the in-conveyor 52, like the main conveyor 50, includes a conveyor device 100 and a conveyor-width changing device 102. It is noted that the same reference numerals will be used for functionally corresponding elements to identify their correspondences, and an explanation thereof will be omitted. As shown in FIGS. 4 and 5, the in-conveyor 52 further includes a stopper device 110 that includes: a rectangular stopper plate 112; and a stopper-plate elevating and lowering device 114 as a stopper-plate moving device. The stopper device 110 is provided on a downstream end portion of the in-conveyor 52 in the conveying direction.

The stopper-plate elevating and lowering device 114 includes an air cylinder 116 as a drive source. The air cylinder is a fluidic cylinder that is one kind of a fluidic actuator. As shown in FIGS. 4 and 5, the air cylinder 116 is provided on a main body 118 of the in-conveyor 52 so as to face upward, and the stopper plate 112 is mounted on a projecting end portion of a piston rod 120. The stopper plate 112 is mounted on the piston rod 120 in an attitude in which a longitudinal direction of the stopper plate 112 is parallel to a conveyor-width direction, and a plane of the stopper plate 112 is at a right angle to the conveying direction, i.e., vertical. The stopper plate 112 is disposed at a position downstream of and distant from the fixed side frame 68 and the movable side frame 68 in the conveying direction, and the stopper-plate elevating and lowering device 114 is provided upstream of the stopper plate 112.

In the present printer 10, as shown in FIG. 4, the circuit substrate 96 is conveyed in an attitude in which its longitudinal direction is parallel to the conveyor-width direction of the front conveyor 22. The stopper plate 112 has a length that is equal to or longer than a longest one of circuit substrates of various kinds which are available in printing using solder cream or paste (hereinafter simply referred to as "solder") as a printable material. One end portion of the stopper plate 112 in its longitudinal direction is located near the fixed side frame 68, while the other end portion thereof is located at a rear of the movable side frame 68. Thus, the stopper plate 112 can contact an entire downstream end portion of the circuit substrate of any kind to stop its movement. Also, the stopper plate 112 is thin. Thus, even where the stopper plate 112 is provided on the downstream end portion of the in-conveyor 52, the stopper device can be provided without the stopper plate 112 projecting to the main conveyor 50 or without a width of the in-conveyor 52 being made larger.

Figure 5A:
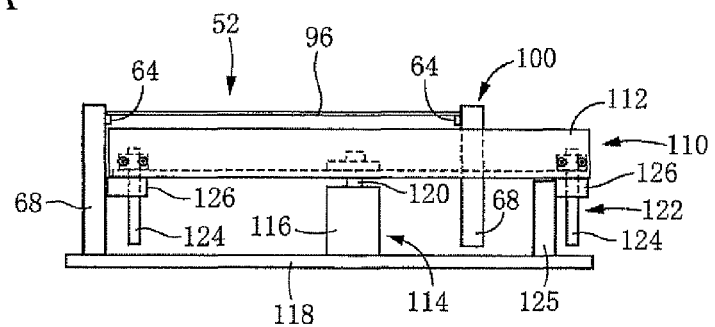
Figure 5B:
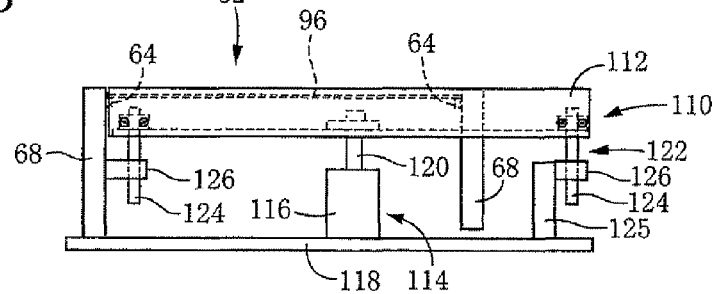

Extension and contraction of the piston rod 120 cause the stopper plate 112 to be selectively moved to one of: a retracted position shown in FIG. 5A at which the stopper plate 112 allows passage of the circuit substrate 96 by being retracted to a lower side of a conveyance path through which the circuit substrate 96 is conveyed by the in-conveyor 52; and an operative position shown in FIG. 5B at which the stopper plate 112 stops the movement of the circuit substrate 96 by being positioned in the conveyance path to contact the circuit substrate 96. When elevated and lowered, the stopper plate 112 is guided by a guiding device 122. As shown in FIG. 5, the guiding device 122 includes: guide rods 124 as a pair of guided members extending in the vertical direction and respectively provided on opposite end portions of the stopper plate 112 in the longitudinal direction; and guide blocks 126 as guide members respectively provided on the fixed side frame 68 and a support portion 125 of the main body 118 such that the guide rods 124 are fitted in the respective guide blocks 126 so as to be elevated and lowered. The outconveyor 54 has a similar in construction to the in-conveyor 52.

In the present printer 10, a dimension of each of the in-conveyor 52 and the outconveyor 54 is shorter in the conveying direction than a largest one of dimensions of the circuit substrates of various kinds which are available in printing of the solder. As in the circuit substrate 96 indicated by a two-dot chain line in FIG. 2, an upstream end portion, in the conveying direction, of the circuit substrate of some type may project from each of the conveyors 52, 54 to an upstream side thereof in the conveying direction in a state in which the movement of the circuit substrate is stopped by the stopper device 110. When an amount of the projection of the circuit substrate is a certain amount, it may be impossible to activate a device that is provided upstream of the conveyor 52 or 54, in the present embodiment, the device is the shuttle conveyor 12 for the in-conveyor 52, or the main conveyor 50 for the outconveyor 54. In such a case, the activation of the upstream device is inhibited until the circuit substrate is unloaded from the conveyor 52 or 54.

As shown in FIG. 2, the rear conveyor 24 is provided parallel to the front conveyor 22 and has a length that extends from one to the other end of the printer 10 in the conveying direction. Like the conveyors 52, 54, the rear conveyor 24 includes a conveyor device 130, a conveyor-width changing device 132, and a stopper device 134. It is noted that the same reference numerals will be used for functionally corresponding elements to identify their correspondences, and an explanation thereof will be omitted.

As shown in FIG. 1, the components provided in or on the printer main body 20 are covered with a housing 140. A front portion of a top wall 142 of the housing 140 is an openable cover 144, and an operator opens this cover 144 to perform working operations on the components or devices in the housing 140.

The control device 30 is constituted mainly by a control computer and configured to control, e.g., drive sources of various devices of the printer 10. The drive sources are constituted by motors, many of which are one kind of an electric motor, which is constituted by a servomotor as an electric rotary motor precisely controllable with respect to its rotation angle. The electric motor may be constituted by a linear motor. The control device 30 is controlled in a coordinated manner by an overall control device 148 (see FIG. 1) that controls the overall electronic-circuit assembly line. The overall control device 148 is mainly constituted by a host computer.

As shown in FIG. 2, the shuttle conveyor 12 includes a conveyor main body 150, a movable conveyor 152, and a movable-conveyor moving device 154. The movable conveyor 152 includes a conveyor device 160, a conveyor-width changing device 162, and a stopper device 164. The conveyor device 160 is similar in construction to the conveyor devices 100 of the respective conveyors 52, 54. The conveyor device 160 includes: a pair of conveyor belts 168 respectively supported by a pair of side frames 166; and belt rotating devices 170 respectively including rotation motors 169 as drive sources for rotating the respective conveyor belts 168.

The conveyor-width changing device 162 includes a width changing motor 174, a belt 176, and a plurality of pulleys 178 and is provided on one of the side frames 166 or a fixed side frame 166 (a lower side frame 166 in FIG. 2) and a support frame 180. When the belt 176 is rotated by the width changing motor 174, the other of the side frames 166 or a movable side frame 166 connected to the belt 176 is moved with respect to the fixed side frame 166 and the support frame 180 to any position in the conveyor-width direction or the front and rear direction. It is noted that the states "fixed" and "movable" of the side frames 166 are effective in changing the conveyor width.

As shown in FIG. 2, the movable-conveyor moving device 154 includes: a shuttle motor 190 as a drive source; a belt 192; and a plurality of pulleys 194. The belt 192 is a timing belt, and each of the pulleys 194 is a timing pulley. When one of the pulleys 194 is rotated by the shuttle motor 190, the belt 192 is rotated, whereby the fixed side frame 166 and the support frame 180 connected to the belt 192 are moved, and the movable side frame 166 is moved together via the conveyor-width changing device 162. As a result, the movable conveyor 152 is moved to any position in the front and rear direction.

As shown in FIG. 2, the movement of the pair of side frames 166 and the support frame 180 is guided by a guiding device 200. The guiding device 200 includes a pair of guide rods 202 each extending in the front and rear direction. In the present embodiment, each of the belt 192 and the pair of guide rods 202 extends in the front and rear direction from a rear side of the rear conveyor 24 in the printer 10 to a front side of the front conveyor 22 through the front conveyor 22. A stroke of the movement of the movable conveyor 152 is longer than a distance between a rear end of the rear conveyor 24 and a front end of the front conveyor 22. Thus, as indicated by solid lines in FIG. 2, the movable conveyor 152 can be moved to a position located in front of a position at which the movable conveyor 152 is continuous to or next to the front conveyor 22 to receive the circuit substrate passed from the front conveyor 22. With this state, the operator can open a cover 204 (see FIG. 1) provided on a front portion of the shuttle conveyor 12 to easily perform the working operations on the movable conveyor 152 near the movable conveyor 152. Openings for receiving and passing the circuit substrate are formed in the housing 140 of the printer 10 and in a housing of the shuttle conveyor 12 provided with the cover 204.

As shown in FIG. 2, the stopper device 164 includes: a stopper piece 210 as a stopper member; and a stopper-piece elevating and lowering device 212 as a stopper-piece moving device and is provided on a downstream end of the movable side frame 166. The stopper-piece elevating and lowering device 212 is constituted by an air cylinder and configured to: lower the stopper piece 210 to an operative position at which the stopper piece 210 can contact the circuit substrate by being positioned in the conveyance path; and elevate the stopper piece 210 to a retracted position at which the stopper plate 210 allows passage of the circuit substrate by being retracted to an upper side of the conveyance path. In the present embodiment, each of the shuttle conveyors 12 is controlled by the control device 30 of a corresponding one of the printers 10, which one is adjacent to the shuttle conveyor 12 on an upstream side thereof. A control device may be provided on each shuttle conveyor 12.

Figure 6:
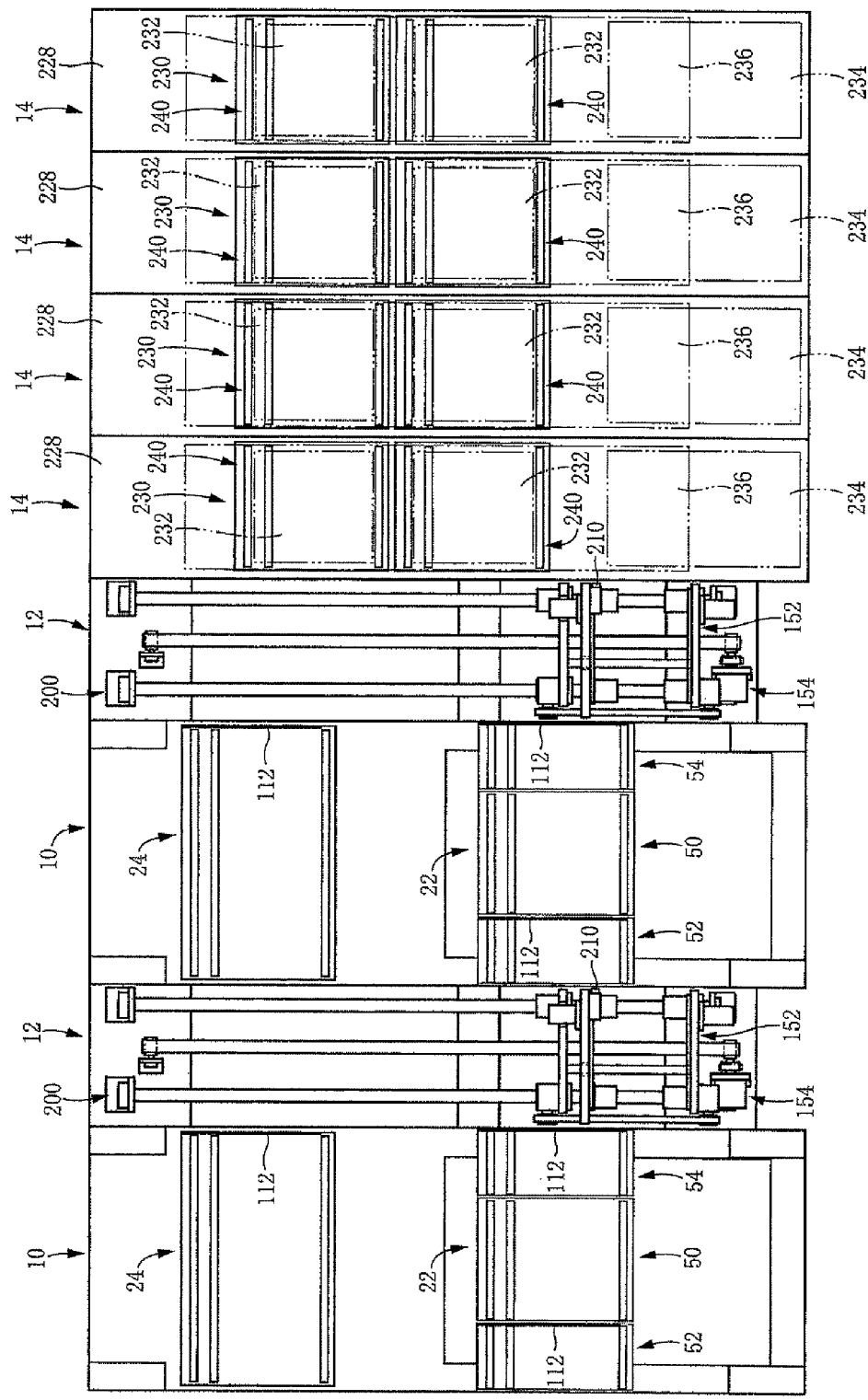
FIG. 6 is a plan view schematically showing the electronic-circuit assembly line.

In the present embodiment, each of the four mounting machines 14 is similar in construction to each electronic-circuit-component mounting machine disclosed in JP-A-2004-104075 and is designed in modules. As partly shown in FIG. 1, each of the four mounting machines 14 includes a mounting-machine main body 228, a substrate conveyor device 230, substrate support devices 232 (see FIG. 6), a component supplying device 234, a component mounting device 236, and a control device 238. The four mounting machines 14 cooperate to mount electronic circuit components onto a single circuit substrate in parallel. The substrate conveyor device 230 includes a pair of conveyors 240. As shown in FIG. 6, these conveyors 240 are arranged next to each other in the front and rear direction of the mounting-machine main body 228 so as to be parallel to each other. One of the conveyors 240 on a front side (a lower conveyor 240 in FIG. 6) may be referred to as "front conveyor 240", and the other of the conveyors 240 on a rear side may be referred to as "rear conveyor 240". Each of the conveyors 240 is constituted by a belt conveyor in the present embodiment, and its conveyor width is automatically adjusted by a conveyor-width changing device, not shown. The substrate support devices 232 are provided for the respective two conveyors 240. The circuit substrate conveyed by any of the conveyors 240 is also supported on a corresponding one of the substrate support devices 232, and the electronic circuit components are mounted. The control device 238 is constituted mainly by a computer and controlled by the overall control device 148 in a coordinated manner.

In the electronic-circuit assembly line constructed above, the solder is printed on the circuit substrate in various manners. One of them will be explained with reference to FIG. 7.

In this manner, the two printers 10 print the solder in parallel onto front faces and back faces of circuit substrates having the same model number. The mounting machines 14 mount the electronic circuit components on the face on which the solder has been printed.

In the present embodiment, an upstream one of the two printers 10 (hereinafter simply referred to as "upstream printer 10") prints the solder on the front face of the circuit substrate, and a downstream one of the printers 10 (hereinafter simply referred to as "downstream printer 10") prints the solder on the back face of the circuit substrate. Each of the two printers 10 is provided with the mask 34 that corresponds to one of the front and back faces on which the solder is to be printed.

In each of the two printers 10, when the circuit substrate is loaded on any of the rear conveyor 24 and the in-conveyor 52 and the outconveyor 54 of the front conveyor 22, the stopper plate 112 is positioned at the operative position to stop the movement of the circuit substrate, while when the circuit substrate is unloaded from any of the conveyors 52, 54, 24, the stopper plate 112 is retracted to the retracted position. In the present embodiment, the stopper plate 112 is provided on the downstream end of each of the conveyors 52, 54, 24. Thus, the circuit substrate can be loaded or conveyed on the in-conveyor 52 at a position adjacent to the main conveyor 50 and kept staying at the position. Likewise, the circuit substrate can be loaded or conveyed on each of the rear conveyor 24 and the outconveyor 54 at a position adjacent to the shuttle conveyor 12 and kept staying at the position. Therefore, the circuit substrate can be speedily loaded onto the main conveyor 50 and the shuttle conveyor 12.

The movable conveyor 152 (hereinafter may be referred to as "upstream movable conveyor 152") of an upstream one of the two shuttle conveyors 12 which is disposed between the adjacent two printers 10 is selectively moved to one of a front-conveyor corresponding position indicated by a solid line in FIG. 7A at which the upstream movable conveyor 152 is continuous to the front conveyors 22 of the upstream and downstream printers 10 in a state in which a position of the upstream movable conveyor 152 in the front and rear direction is aligned with positions of the front conveyors 22 in the front and rear direction; and a rear-conveyor corresponding position indicated by a two-dot chain line at which the upstream movable conveyor 152 is continuous to the rear conveyors 24 of the printers 10 in a state in which the position of the upstream movable conveyor 152 in the front and rear direction is aligned with positions of the rear conveyors 24 in the front and rear direction. It is noted that even if there is positional error in the front and rear direction between the front conveyors 22 of the adjacent printers 10 and between the rear conveyors 24 of the adjacent printers 10, the upstream movable conveyor 152 is stopped at positions respectively continuous to the front conveyors 22 of the upstream and downstream printers 10 or respectively continuous to the rear conveyors 24 of the printers 10, whereby the positional error can be eliminated, enabling the circuit substrate to be passed and received. The positional error between the front conveyors 22 and between the rear conveyors 24 are caused by at least one of positional error between the printers 10 and positional error of the conveyors 22, 24 in the printers 10, but in any of the cases the positional error between the front conveyors 22 and between the rear conveyors 24 can be eliminated. This facilitates placement of the conveyors 22, 24 in the printers 10 and placement of the printers 10.

The movable conveyor 152 (hereinafter may be referred to as "downstream movable conveyor 152") of a downstream one of the two shuttle conveyors 12 which is disposed between the downstream printer 10 and a most upstream one of the mounting machines 14 is selectively moved to one of: a printer-rear-conveyor corresponding position indicated by a solid line in FIG. 7B at which the downstream movable conveyor 152 is continuous to the rear conveyor 24 of the downstream printer 10; a mounting-machine-rear-conveyor corresponding position indicated by a one-dot chain line at which the downstream movable conveyor 152 is continuous to the rear conveyor 240 of the most upstream mounting machine 14; a printer-front-conveyor corresponding position indicated by a broken line at which the downstream movable conveyor 152 is continuous to the front conveyor 22 of the downstream printer 10; and a mounting-machine-front-conveyor corresponding position indicated by a two-dot chain line at which the downstream movable conveyor 152 is continuous to the front conveyor 240 of the most upstream mounting machine 14. In any of the movable conveyors 152, the stopper piece 210 is positioned at the operative position when the circuit substrate is loaded, and the stopper piece 210 is positioned at the retracted position when the circuit substrate is unloaded. Since the downstream movable conveyor 152 can be moved to any position to eliminate the positional error, it is possible to facilitate placement of the conveyors 22, 24 in the downstream printer 10, placement of the downstream printer 10, placement of the front and rear conveyors 240 in the most upstream mounting machine 14 (to which the circuit substrate is supplied from the downstream printer 10), and placement of the mounting machine 14.

Figure 7A:
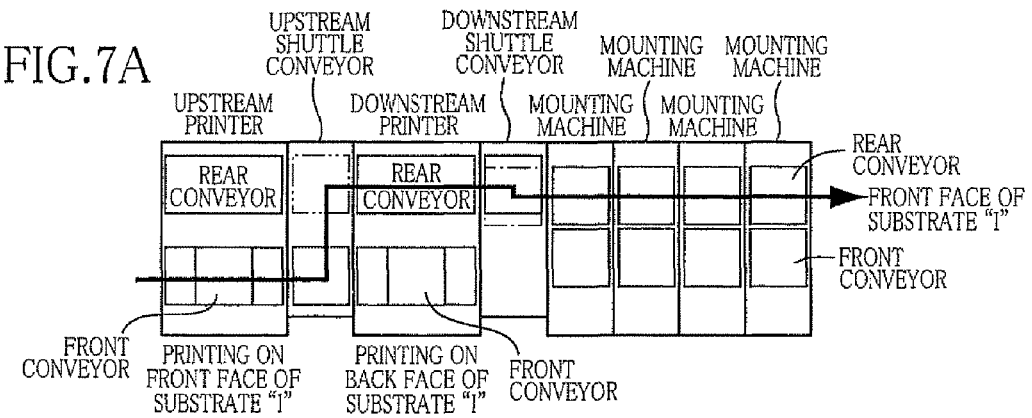
FIGS. 7A-7F are views for explaining one mode of printing of solder on a circuit substrate and mounting of an electronic circuit component on the circuit substrate in the electronic-circuit assembly line.

As shown in FIG. 7A, a circuit substrate of a model number "I" as a first model (hereinafter simply referred to as "substrate "I"") is supplied to the upstream printer 10 with its front face upward and is conveyed or loaded by the in-conveyor 52 to its downstream end. When a state in which the substrate "I" can be loaded onto the main conveyor 50 is established, the stopper plate 112 is retracted. The in-conveyor 52 and the main conveyor 50 are then activated, and the substrate "I" is loaded from the in-conveyor 52 onto the main conveyor 50 for the printing of the solder. The printing of the solder by the printing device 28 is well known, and an explanation thereof is omitted.

After completion of the printing, the substrate "I" is unloaded from the main conveyor 50 onto the outconveyor 54 and stopped by contacting the stopper plate 112 at the downstream end of the outconveyor 54. The substrate "I" is unloaded from the outconveyor 54 onto the movable conveyor 152 in a state in which the upstream movable conveyor 152 is positioned at the front-conveyor corresponding position, and the substrate "I" is then conveyed to a downstream end of the movable conveyor 152. After the transfer of the circuit substrate, the upstream movable conveyor 152 is moved to the rear-conveyor corresponding position, and the substrate "I" having been printed with the solder is transferred to the rear conveyor 24 of the downstream printer 10. The transfer is performed with the rear conveyor 24 being empty. The circuit substrate is conveyed to the downstream end of the rear conveyor 24 and stopped to wait for transfer to the downstream movable conveyor 152. The substrate "I" is transferred from the rear conveyor 24 to the downstream movable conveyor 152 in a state in which the downstream movable conveyor 152 is positioned at the printer-rear-conveyor corresponding position. The printed circuit substrate is allowed by the rear conveyor 24 to pass through the printer 10 and bypasses a printing portion on which the printing device 28 is provided, whereby the conveyance and printing of the circuit substrate are performed in parallel.

After the transfer of the circuit substrate, the downstream movable conveyor 152 is moved to the mounting-machine-rear-conveyor corresponding position to convey the substrate "I" onto the rear conveyor 240 of the most upstream mounting machine 14. The component mounting device 236 then mounts the electronic circuit components onto the front face of the substrate "I". The substrate "I" is then conveyed by the rear conveyors 240 of the four mounting machines 14, and the electronic circuit components are mounted on the substrate "I".

Figure 7B:
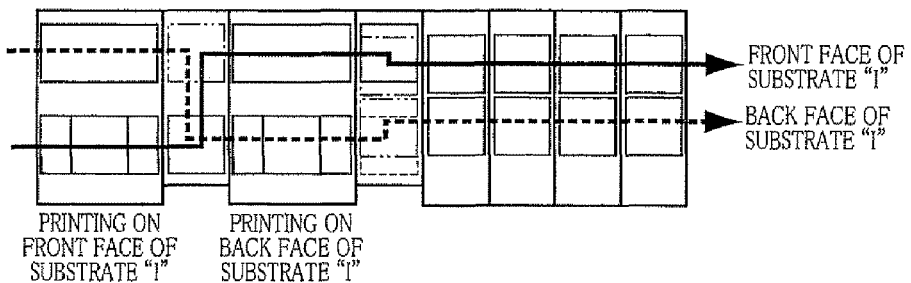

As indicated by a broken line in FIG. 7B, the substrate "I" for which the electronic circuit components have been mounted on its front face is supplied to the rear conveyor 24 of the upstream printer 10 and conveyed to its downstream end in a state in which the back face of the substrate "I" faces upward. The substrate "I" is conveyed through the upstream printer 10 by the rear conveyor 24 and transferred onto the upstream movable conveyor 152 in the state in which the upstream movable conveyor 152 is positioned at the rear-conveyor corresponding position. After the transfer, the upstream movable conveyor 152 is moved to the front-conveyor corresponding position, and the substrate "I" is transferred to the in-conveyor 52 of the downstream printer 10. The substrate "I" is then loaded from the in-conveyor 52 onto the main conveyor 50, and the solder is printed on the back face of the substrate "I".

After the printing, the substrate "I" is unloaded from the main conveyor 50 onto the outconveyor 54 and transferred onto the downstream movable conveyor 152 in a state in which the downstream movable conveyor 152 is positioned at the printer-front-conveyor corresponding position. After transfer, the downstream movable conveyor 152 is moved to the mounting-machine-front-conveyor corresponding position, and the substrate "I" is conveyed to the front conveyor 240 of the mounting machine 14. The component mounting device 236 then mounts the electronic circuit components on the back face of the substrate "I". The substrate "I" is conveyed by the front conveyors 240 of the four mounting machines 14, and the electronic circuit components are mounted on the back face of the substrate "I" in order. The printings of the solder on the front face and the back face of the substrate "I" are performed in parallel, and the substrate "I" having been printed on its front face with the solder and the substrate "I" having been printed on its back face with the solder are supplied to the mounting machines 14. The mountings of the electronic circuit components on these substrates "I" are performed in parallel by a row of a plurality of the mounting machines, in the present embodiment, the four mounting machines 14.

It is noted that it has been explained that the mounting of the electronic circuit components on the front face of the substrate "I" is performed on the rear conveyor 240 while the mounting of the electronic circuit components on the back face is performed on the front conveyor 240, but this electronic-circuit assembly line may be configured such that the mounting on the front face is performed on the front conveyor 240 while the mounting on the back face is performed on the rear conveyor 240. In such a case, where the printing on the front face of the substrate "I" is performed by the downstream printer 10, the movable conveyors 152 of the upstream and downstream shuttle conveyors 12 need a shorter distance for their movement, leading to higher efficiency of the conveyance.

Figure 7C:
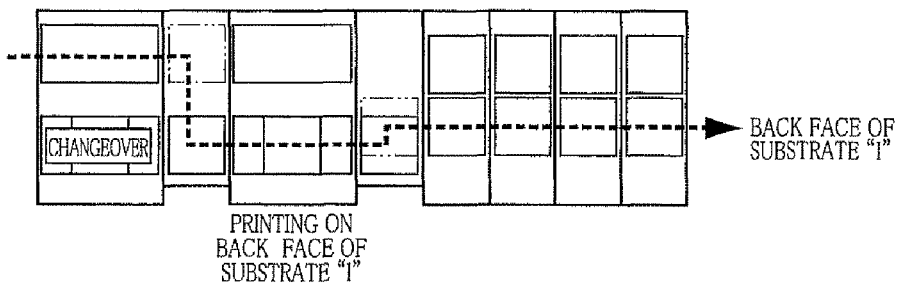

After completion of the mounting of the electronic circuit components on the front faces of the substrates "I" of a predetermined number, electronic circuit components are mounted on front faces and back faces of circuit substrates of a model number "II" that is different from the model number "I". For this mounting, as shown in FIG. 7C, a changeover is carried out in the upstream printer 10, and in this changeover the mask 34 is replaced with another one and the conveyor width for the circuit substrate is changed, for example. The conveyor width is changed in the front conveyor 22 of the upstream printer 10 and in the rear conveyor 24 of the downstream printer 10. During this changeover, the printing of the solder and the mounting of the electronic circuit components on the back face of the substrate "I" are performed in parallel with the changeover.

Figure 7D:
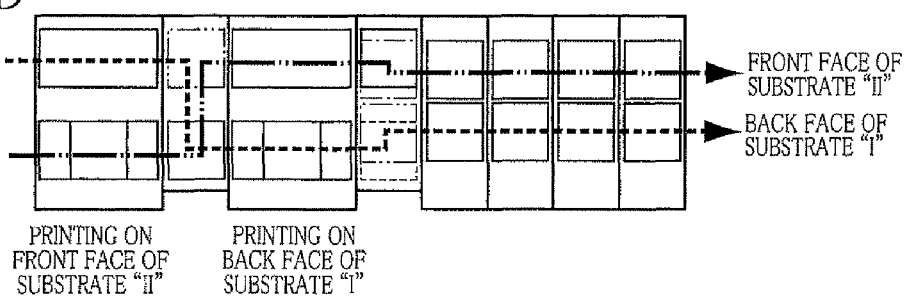

After completion of the changeover, as shown in FIG. 7D, the printing of the solder and the mounting of the electronic circuit components on the front face of the substrate "II" are started, and the printing of the solder on the circuit substrates of two models are performed in parallel. Thus, the conveyor width of the movable conveyor 152 of each of the two shuttle conveyors 12 is changed according to which of the substrates "I" and "II" is to be conveyed. This change is performed before the movable conveyor 152 reaches a conveyor corresponding position at which the circuit substrate is received, that is, at least one of during the movement of the movable conveyor 152 to the conveyor corresponding position and before a start of the movement. This prevents that the change of the width increases a time required for the transfer of the circuit substrate, making it possible to reduce an amount of lowering of an operating rate of the screen printing line.

Figure 7E:
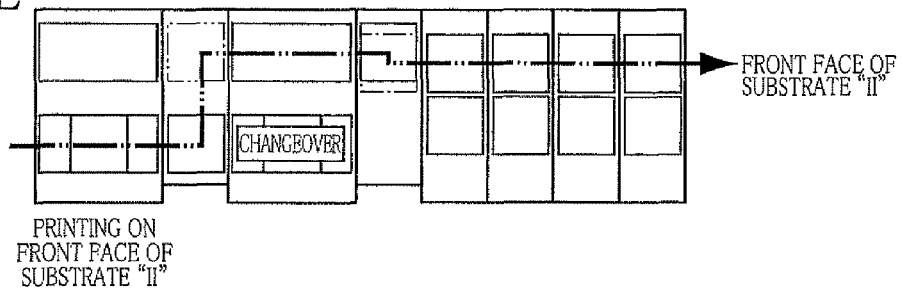
Figure 7F:
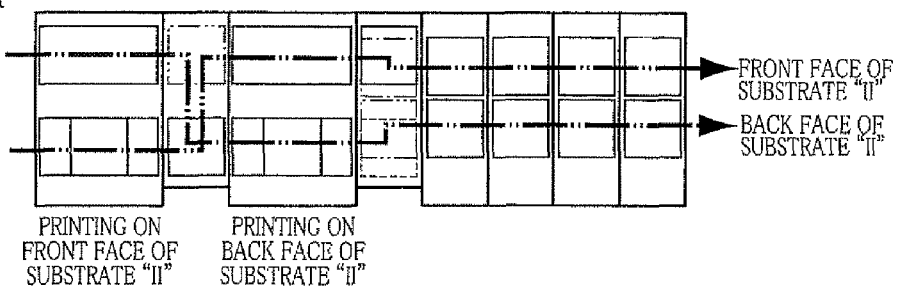

When the electronic circuit components have been mounted on the back faces of all the substrates "I", a changeover is carried out in the downstream printer 10 as shown in FIG. 7E, whereby the solder can be printed on the back face of the substrate "II". In this changeover, the conveyor width is changed in the front conveyor 22 of the downstream printer 10 and in the rear conveyor 24 of the upstream printer 10. The printing of the solder and the mounting of the electronic circuit components on the front face of the substrate "II" are performed in parallel with this changeover. After completion of this changeover, as shown in FIG. 7F, the substrate "II" for which the electronic circuit components have been mounted on its front face is supplied to the rear conveyor 24 of the upstream printer 10, with its back face upward. Since the changeover in one of the two printers 10 and the printing in the other of the printers 10 are performed in parallel, there is no need to stop the mounting machines 14 from mounting the electronic circuit components for a reason of the printers 10.

Figure 8A:
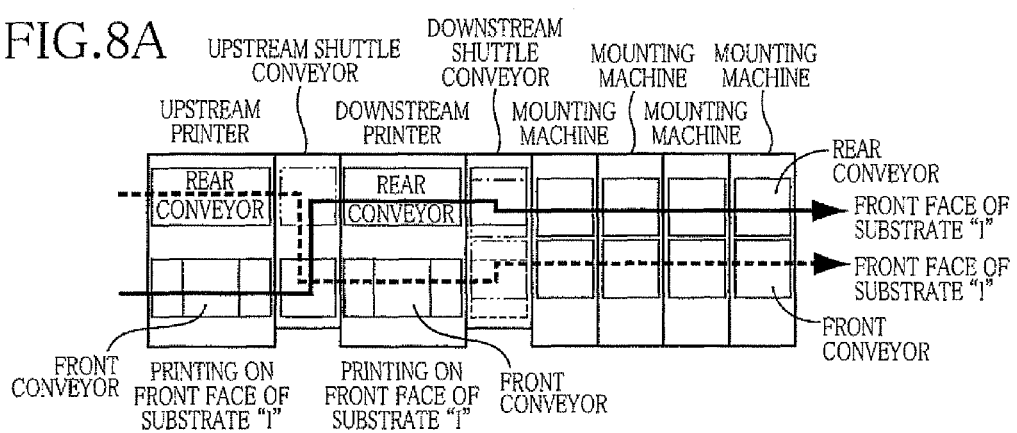
FIGS. 8A and 8B are views for explaining another mode of the printing of the solder on the circuit substrate and the mounting of the electronic circuit component on the circuit substrate in the electronic-circuit assembly line.

In the present electronic-circuit assembly line, as shown in FIG. 8A, the two printers 10 can print the solder in parallel on the same side of the circuit substrates having the same model number. In this case, the same mask 34 is used for the two printers 10, and for example, the solder is printed on the front face of the substrate "I". The substrates "I" are alternately supplied to the upstream printer 10 and the downstream printer 10. The substrate "I" having been printed with the solder in the upstream printer 10 is conveyed by the upstream shuttle conveyor 12, the rear conveyor 24 of the downstream printer 10, and the downstream shuttle conveyor 12 to the rear conveyor 240 of the mounting machine 14, and the electronic circuit components are mounted.

The substrate "I" having been printed with the solder in the downstream printer 10 is supplied to the rear conveyor 24 of the upstream printer 10, loaded by the upstream shuttle conveyor 12 to the front conveyor 22 of the downstream printer 10, and printed with the solder. The substrate "I" is then loaded onto the front conveyor 240 of the mounting machine 14 by the downstream shuttle conveyor 12, and the electronic circuit components are mounted on the substrate "I".

Figure 8B:
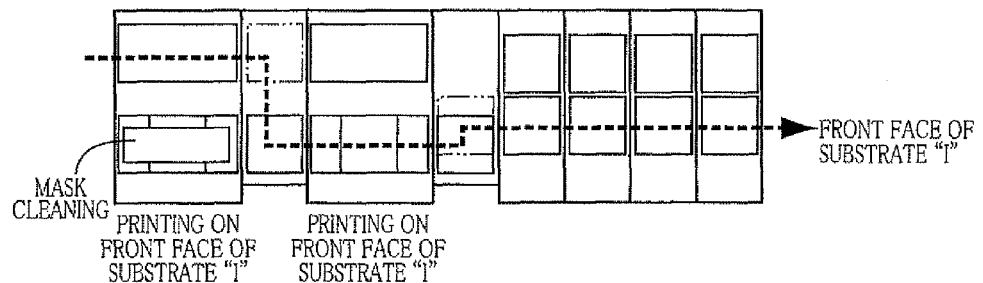

In the present electronic-circuit assembly line, the printers 10 print the solder in parallel on the same side of the circuit substrates of the same type. Thus, even in a case where the printing is interrupted in one of the printers 10 as shown in FIG. 8B, for example, in a case where cleaning of the mask 34 or supply of the solder on the mask 34 is performed, it is possible to obtain the circuit substrates that have been printed on their front faces with the solder.

The screen printing line may include three screen printing machines. There will be next explained one manner of printing of the solder by this screen printing line with reference to FIG. 9.

In the electronic-circuit assembly line according to the present embodiment, three printers 10 are arranged in a row and four shuttle conveyors 12 are respectively provided at positions each between corresponding adjacent two of the printers 10, a position upstream of the most upstream printer 10, and a position downstream of the most downstream printer 10. The most upstream shuttle conveyor 12 is controlled by the control device 30 of the most upstream printer 10. A substrate supplying device 260 is provided upstream of the most upstream shuttle conveyor 12, and a conveyor 266 is provided therebetween. The substrate supplying device 260 and the conveyor 266 are controlled by the overall control device 148.

The substrate supplying device 260 supplies, for example, three types of circuit substrates A, B, C respectively having model numbers that are different from one another. These substrates A, B, C have the same dimensions as one another in the conveyor-width direction. Though not shown, substrate identification codes each as a substrate identifier are placed on the respective substrates A, B, C to indicate substrate identification information. For example, a two-dimensional code is used for each of the substrate identification codes for storing the model number and the dimension of the circuit substrate. The conveyor 266 includes a reading device 268 as a substrate identification device for reading the two-dimensional code. The reading device 268 includes an imaging device, for example. The three printers 10 are for printing the solder on the respective substrates A, B, C in order from the upstream side and respectively hold masks 34 which are different from one another.

The substrate supplying device 260 supplies the substrates A, B, C in no particular order. Thus, the circuit substrate is first supplied from the substrate supplying device 260 to the conveyor 266, and then the substrate identification code of the circuit substrate is read by the reading device 268. A result of this reading is transmitted to the overall control device 148, and the type of the circuit substrate is obtained. Based on the obtained type of the circuit substrate, it is determined which of the three printers 10 is to print the solder and which of the conveyors each of the four shuttle conveyors 12 receives and passes the circuit substrate from and to. The overall control device 148 then outputs control commands to the control devices 30 of the respective three printers 10.

The movable conveyor 152 of the most upstream shuttle conveyor 12 is moved to a conveyor corresponding position continuous to the conveyor 266 and receives the circuit substrate. For example, in a case where the substrate A has been supplied, the most upstream printer 10 prints the solder, and as indicated by solid-line arrow in FIG. 9 the substrate A is conveyed by and through the rear conveyors 24 of the two downstream printers 10 and loaded onto the rear conveyor 240 of the mounting machine 14. In a case where the substrate C has been supplied, as indicated by two-dot-chain-line arrow in FIG. 9 the substrate C is conveyed by and through the rear conveyors 24 of the two upstream printers 10, then the most downstream printer 10 prints the solder, and then the substrate C is loaded onto the front conveyor 240 of the mounting machine 14. In a case where the substrate B has been supplied, as indicated by broken-line arrow in FIG. 9 the middle printer 10 prints the solder, and the substrate B is conveyed through the most upstream and most downstream printers 10 and loaded onto the rear conveyor 240 of the mounting machine 14. The movable conveyor 152 of each of the four shuttle conveyors 12 is operated such that the printing of the solder on the substrates A, B, C, the conveyance of the substrates through the printers 10, and the loading of the substrates on the mounting machine 14 are carried out in this way.

Equal to or more than four printers may be provided such that circuit substrates of equal to or more than four types are supplied in no particular order and printed with the printable materials.

The conveyor width of each of the rear conveyors 24 and the movable conveyors 152 is automatically changed. Thus, the printings of the solder can be carried out in any order or no particular order on a plurality of types of the circuit substrates having different dimensions in the conveyor-width direction. In this case, it is preferable that the substrate supplying device is configured to be capable of supplying specified ones of the circuit substrates of the plurality of types in any order or that the substrate identification device is provided in the substrate supplying device to obtain the type of the circuit substrate being supplied. In any case, the circuit substrate is received and passed while the conveyor width of each of the four movable conveyors 152 and the three rear conveyors 24 is changed according to the type of the circuit substrate to be conveyed.

The substrate identification device may be provided in the shuttle conveyor disposed upstream of the most upstream printer. The plurality of types of the circuit substrates having the same conveyor width are loaded onto the movable conveyor of the most upstream shuttle conveyor in no particular order, and the substrate identification device reads the substrate identification code to obtain the type of the loaded circuit substrate. Based on the obtained type of the circuit substrate, operations of the plurality of the printers and the shuttle conveyors are determined.

The screen printing line may include four screen printing machines. There will be next explained one manner of printing of the solder by this screen printing line with reference to FIG. 10.

In the present screen printing line, shuttle conveyors 12 are respectively provided at positions each between corresponding adjacent two of four printers 10 and a position downstream of the most downstream printer 10. Masks identical to each other are respectively mounted on the two upstream printers 10, and these printers 10 print the solder on the front faces of the substrates "I". On the other hand, masks identical to each other are respectively mounted on the two downstream printers 10, and these printers 10 print the solder on the back faces of the substrates "I".

Figure 10A:
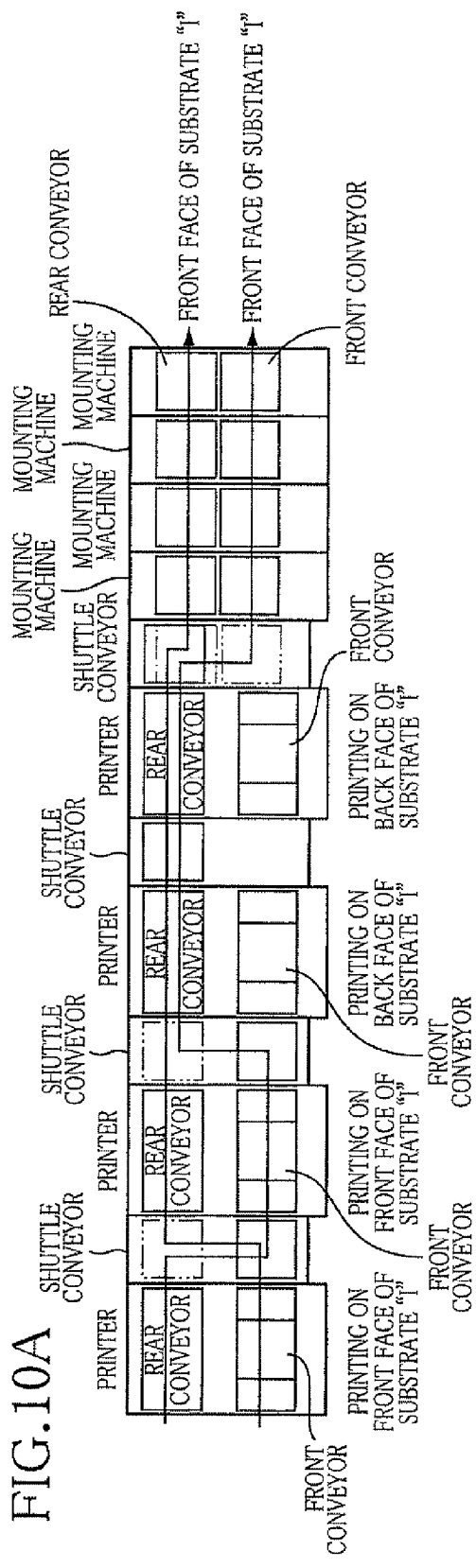
FIGS. 10A and 10B are views each for explaining printing of solder on a circuit substrate and mounting of an electronic circuit component on the circuit substrate in an electronic-circuit assembly line that includes a screen printing line according to still another embodiment.
Figure 10B:
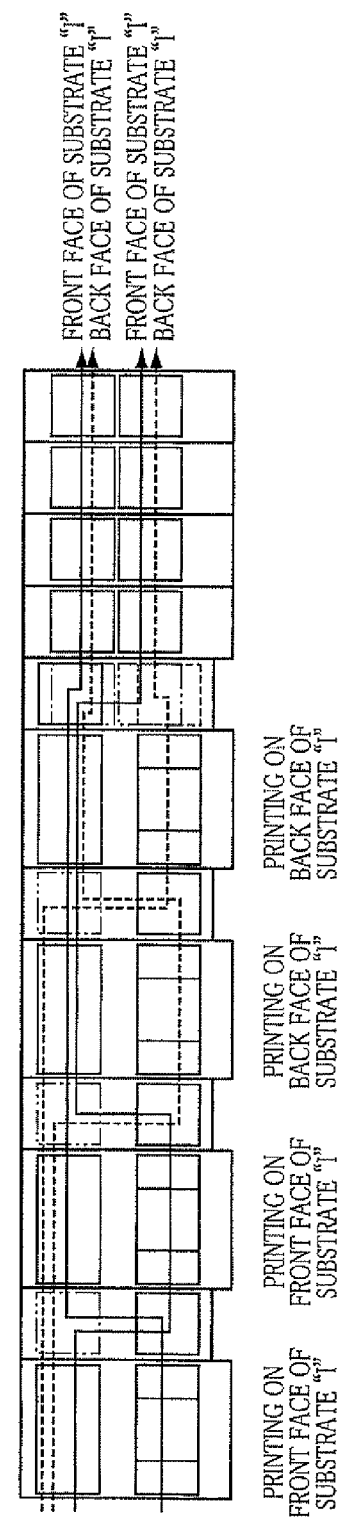

As shown in FIG. 10A, the solder is first printed on the front face of the substrate "I". This printing is carried out in the same manner as explained with reference to FIG. 8. The substrates "I" having been printed on their front faces are conveyed through the downstream printers 10 and alternately supplied to the front and rear conveyors 240 of the mounting machine 14. As indicated by broken-line arrows in FIG. 10B, the substrates "I" having been printed on their front faces with the solder are conveyed through the two upstream printers 10 and alternately supplied to the two downstream printers 10 which print the solder on the back faces of the substrates. The substrates "I" on which the printing is completed are alternately supplied to the front and rear conveyors 240 of the mounting machine 14. The present embodiment is an embodiment in which the printing shown in FIG. 8 is carried out on both of the front and back faces of the circuit substrate, and the solder is printed on a front face and a back face of two circuit substrates and on a front face and a back face of other two circuit substrates in parallel, that is, the solder is printed on the four circuit substrates in parallel.

Figure 9:
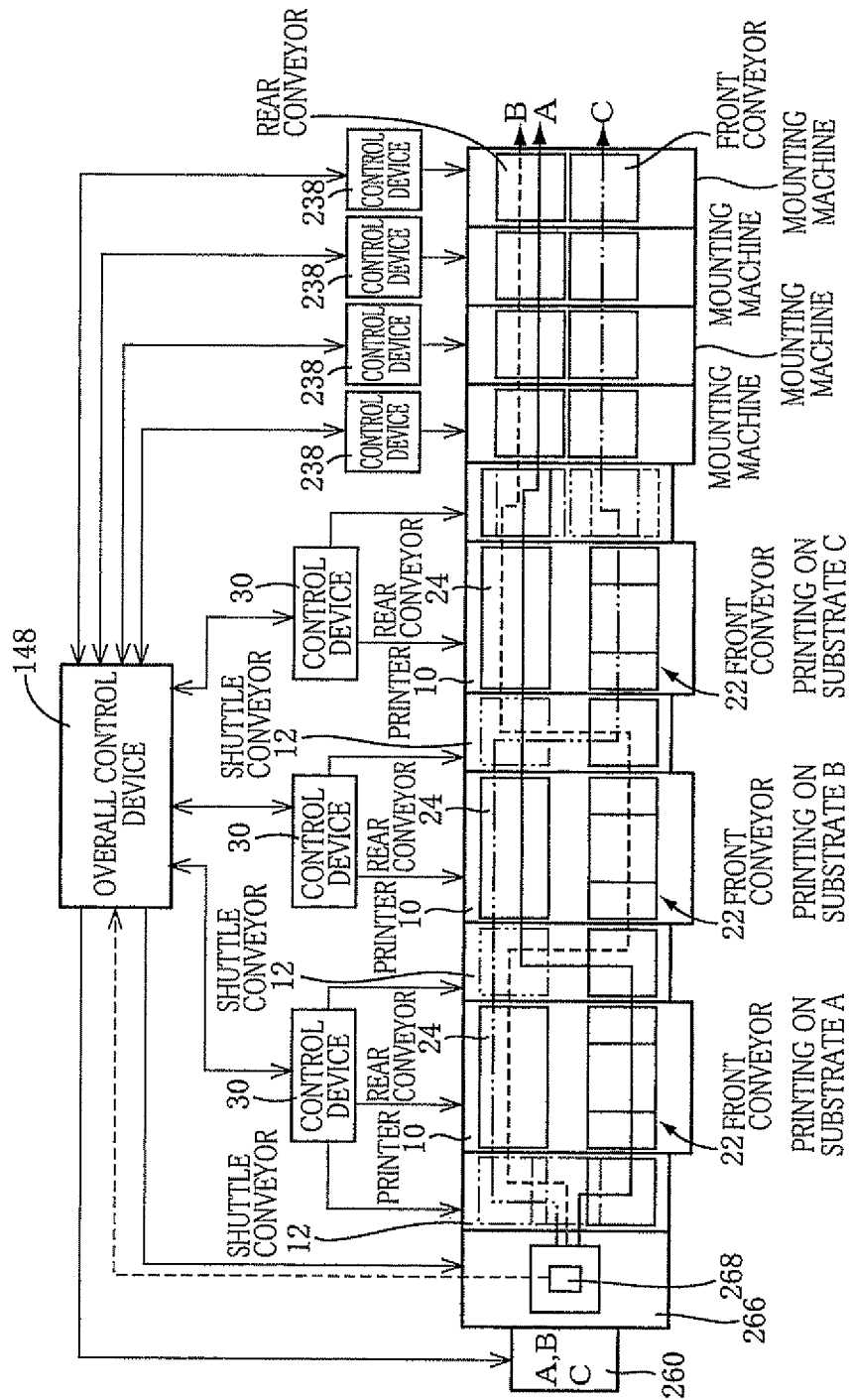
FIG. 9 is a view for explaining printing of solder on a circuit substrate and mounting of an electronic circuit component on the circuit substrate in an electronic-circuit assembly line that includes a screen printing line according to another embodiment.

In the electronic-circuit assembly line shown in FIG. 9, the conveyor 266 is provided between the substrate supplying device 260 and the most upstream shuttle conveyor 12, the reading device 268 is provided on the conveyor 266, and the host computer of the overall control device 148, based on the result of the reading, determines which of the printers 10 is to print the solder to each circuit substrate 96 and outputs the commands to the control devices 30. This construction allows the whole screen printing line to be controlled based on the result of the reading by the single reading device 268. However, in a case where the circuit substrate 96 is taken or inserted in the middle of the screen printing line, inappropriate or wrong printing may be carried out on the circuit substrate 96. In particular, the shuttle conveyor 12 in each of the above-described embodiments can be moved to the position located in front of the position at which the movable conveyor 152 is continuous to the front conveyor 22 for the giving and receiving of the circuit substrate 96 therebetween. Thus, in some cases, the circuit substrate 96 is taken in order to observe a printing status and other conditions of the circuit substrate 96 and inserted after the observation. This may result in a situation where circuit substrates 96 having not been planned are supplied to the printers 10.

Figure 11:
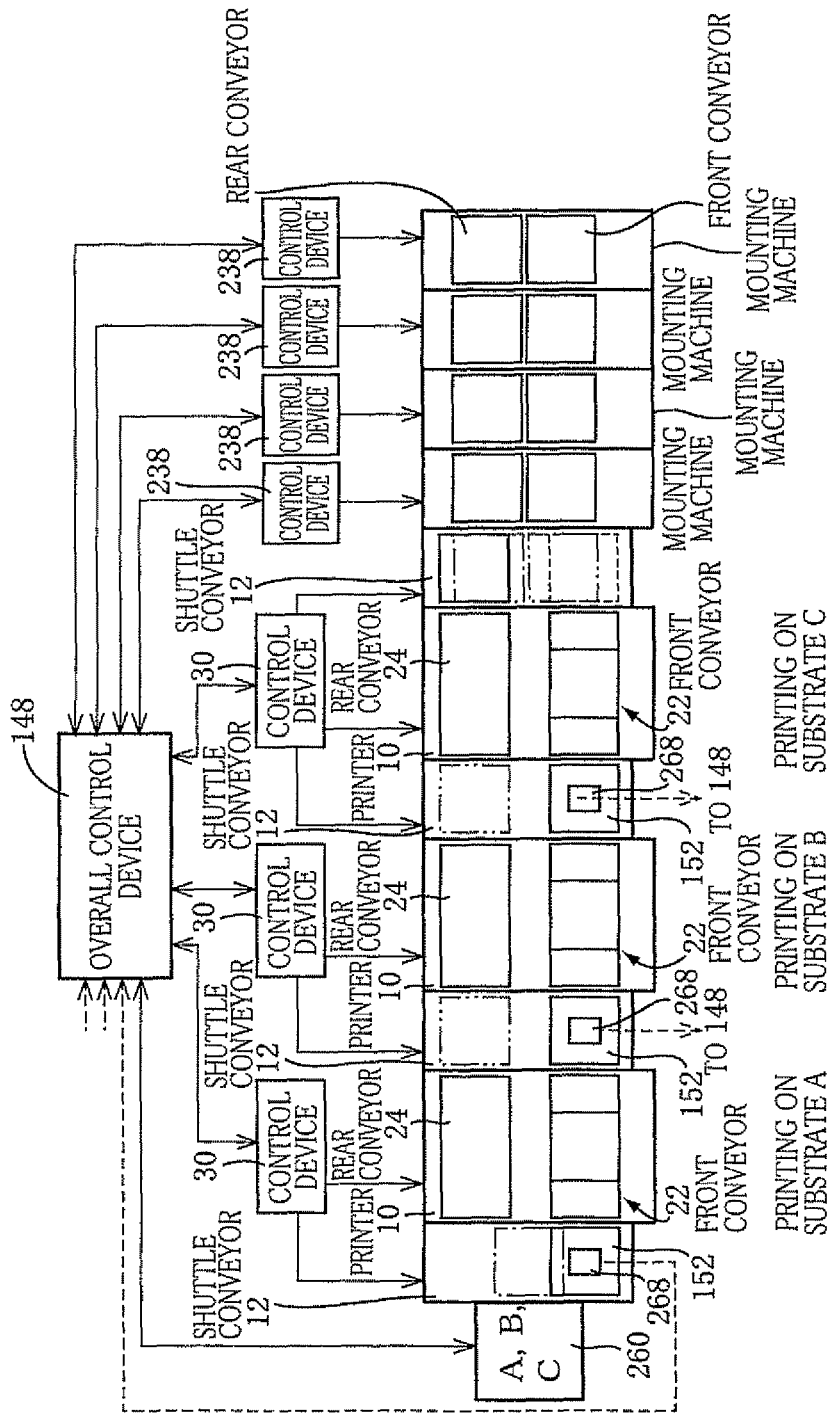
FIG. 11 is a plan view schematically showing an electronic-circuit assembly line that includes a screen printing line according to still another embodiment.

FIG. 11 shows one embodiment for solving this problem. In the present electronic-circuit assembly line, the reading device 268 is provided on the movable conveyor 152 of the shuttle conveyor 12 located upstream of each of the printers 10, and these reading devices 268 are connected to the overall control device 148. Thus, when the circuit substrate 96 is loaded on the movable conveyor 152, the two-dimensional code of the circuit substrate 96 is read by the reading device 268, and the result of this reading is transmitted to the overall control device 148, specifically, to the host computer that mainly constitutes the overall control device 148. The host computer judges the type of the circuit substrate 96 based on the transmitted result of the reading, then determines which of the printers is to carry out the printing on the circuit substrate 96, and then supplies a result of the determination to the control devices 30 of the printers 10 and the shuttle conveyors 12, specifically, to the control computers that mainly constitute the respective control devices 30. It is noted that, in the present embodiment, each of the control devices 30 is configured to control a corresponding one of the printers 10 and one of the shuttle conveyors 12 which is located upstream thereof, and the control device 30 for controlling the most downstream printer 10 is configured to also control one of the shuttle conveyors 12 which is located downstream of the most downstream printer 10. That is, an operating-manner determining portion is constituted by a part of the host computer in the present electronic-circuit assembly line. It is noted that the operating-manner determining portion 6 can be considered to be constituted by a part of the host computer and a part of the control computer.

The control computer, based on the information or command of the host computer, moves the movable conveyor 152 to the position continuous to the front conveyor 22 of the printer 10 when the circuit substrate 96 being on the movable conveyor 152 is to be printed by the printer 10 located downstream thereof, and moves the movable conveyor 152 to the position continuous to the rear conveyor 24 when the circuit substrate 96 being on the movable conveyor 152 is not to be printed by the printer 10 located downstream thereof. The circuit substrate 96 is then passed to the printer 10 in which the printing device 28 carries out the printing on the circuit substrate 96 having been passed to the front conveyor 22 and supported on the substrate support device 62, or the circuit substrate 96 having been passed to the rear conveyor 24 is conveyed through the printer 10.

Thus, in the present electronic-circuit assembly line, even where the circuit substrate 96 is taken or inserted in the middle of the screen printing line, wrong printing of the printers 10 can be reliably prevented.

Figure 12:
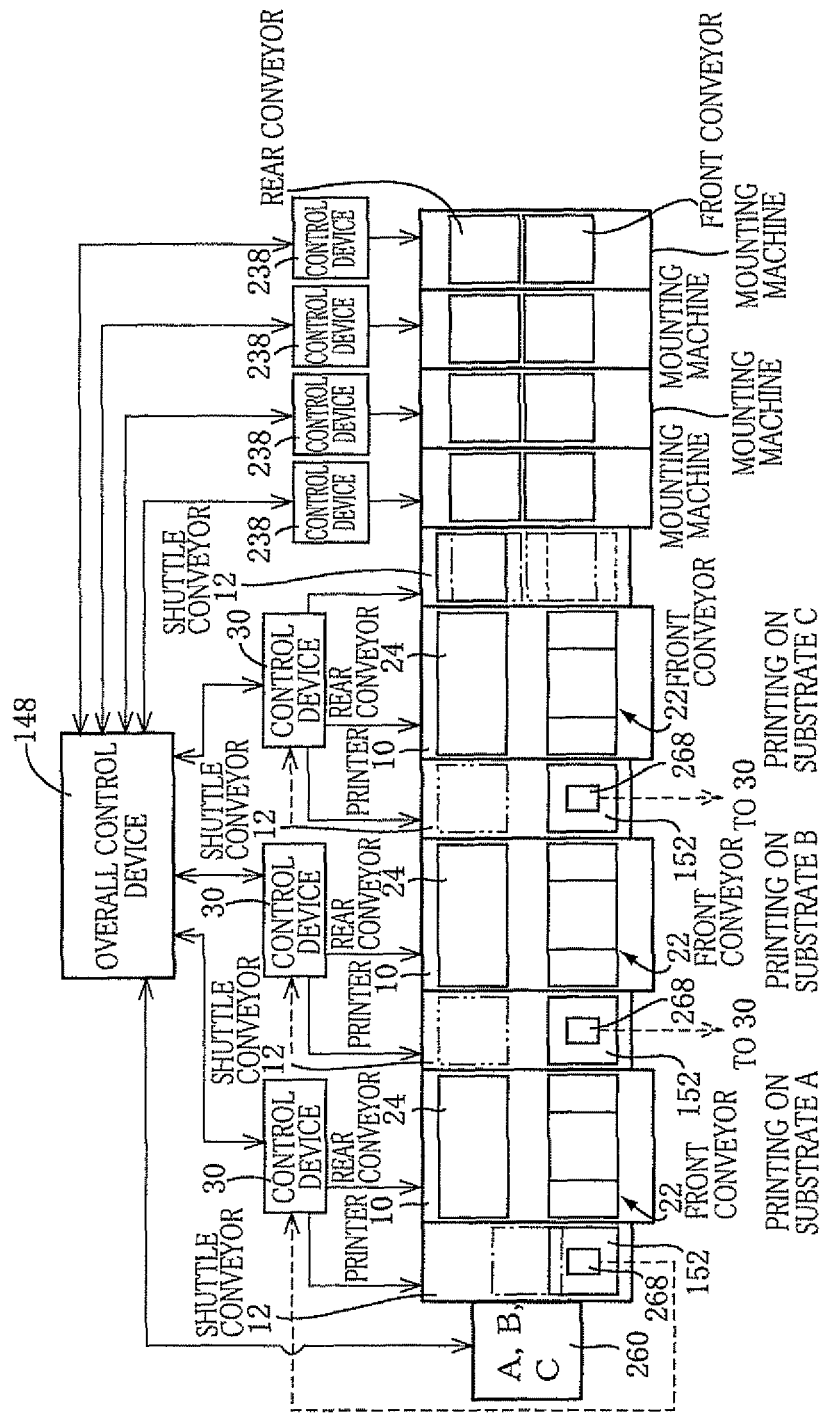
FIG. 12 is a plan view schematically showing an electronic-circuit assembly line that includes a screen printing line according to still another embodiment.

An embodiment shown in FIG. 12 may be employed as the electronic-circuit assembly line. In this electronic-circuit assembly line, the reading device 268 is provided on the movable conveyor 152 of the shuttle conveyor 12 located upstream of each of the printers 10 as in the above-described embodiment, but this embodiment is different from the above-described embodiment in that the reading devices 268 are connected to the respective control computers of the control devices 30. Thus, in the present electronic-circuit assembly line, each control computer judges the type of the circuit substrate 96 based on the result of the reading transmitted from the reading device 268, then judges whether the printing is to be carried out by the printer 10 controlled by the control computer, and controls the shuttle conveyor 12 and the printer 10 based on a result of the judgment. That is, the operating-manner determining portion is constituted by a part of the control computer in the present electronic-circuit assembly line.

Figure 13:
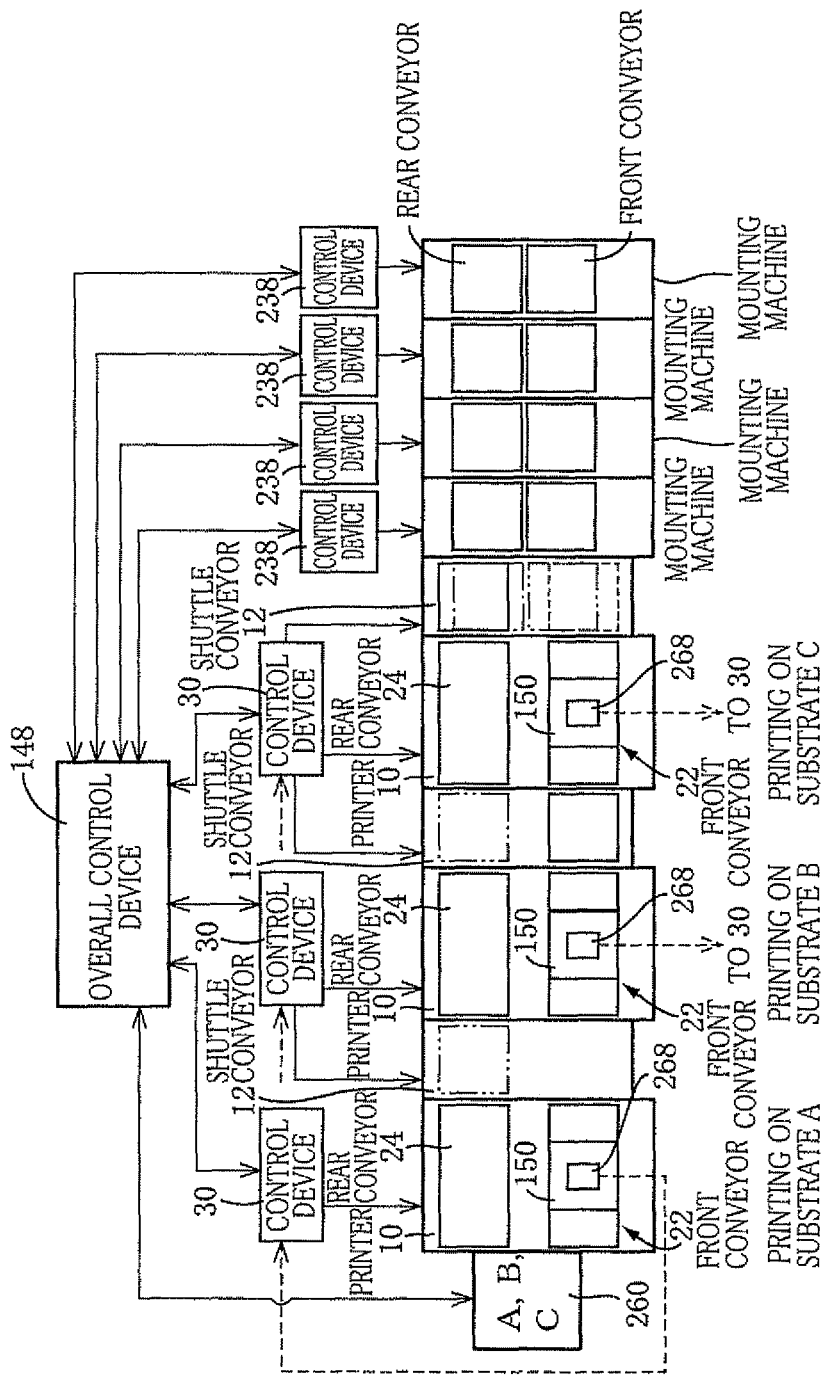
FIG. 13 is a plan view schematically showing an electronic-circuit assembly line that includes a screen printing line according to still another embodiment.

FIG. 13 shows still another electronic-circuit assembly line. In this electronic-circuit assembly line, the reading device 268 is provided on the substrate support device 62 of each printer 10. It should be understood that the reading device 268 can be provided on the front conveyor 22, for example, the in-conveyor 52.

The reading devices 268 are connected to the respective control computers of the control devices 30. Each control computer, based on the result of the reading of the reading device 268, determines whether the printing is to be carried out by the printer 10 controlled by the control computer. The control computer controls the printer 10 to carry out the printing when the printing is to be carried out, and controls the printer 10 to discharge the substrate to the downstream shuttle conveyor 12 through the outconveyor 54 without carrying out the printing when the printing is not to be carried out. That is, the operating-manner determining portion is constituted by a part of the control computer in the present electronic-circuit assembly line.

It is effective to employ, as still another electronic-circuit assembly line, an electronic-circuit assembly line that is constructed by combining the electronic-circuit assembly lines shown in FIGS. 11 and 13, i.e., an electronic-circuit assembly line in which the substrate identification devices such as the reading devices 268 are provided on both of the shuttle conveyors 12 and the printers 10. In this electronic-circuit assembly line, too, the reading device 268 can be connected to any of the host computer and the control computer.

While it has been explained that the printing is carried out on the three types of the circuit substrates 96 in the electronic-circuit assembly line that includes the three printers 10, similar effects can be obtained where substrate recognizing devices such as the reading devices 268 are provided in a screen printing line that includes two or more than three printers 10, e.g., the electronic-circuit assembly line shown in FIGS. 7 and 10, and controls similar to those executed for the electronic-circuit assembly line shown in FIGS. 11-13 are executed.

Also, in a screen printing line that includes one shuttle conveyor 12 and one printer 10, the substrate recognizing device such as the reading device 268 can be provided on at least one of the shuttle conveyor 12 and the printer 10. In addition, such a screen line can be used as one element of the screen printing line including a plurality of the printers 10.

EXPLANATION OF REFERENCE NUMERALS

10: screen printing machine, 12: shuttle conveyor, 22: front conveyor, 24: rear conveyor, 50: main conveyor, 52: in-conveyor, 54: outconveyor, 110: stopper device, 152: movable conveyor, 268: reading device

The invention claimed is:

1. A screen printing line, comprising:
   a plurality of screen printing machines arranged in a right and left direction and each configured to carry out screen printing on a circuit substrate;
   at least one shuttle conveyor each provided between any pair of the adjacent screen printing machines of the plurality of screen printing machines, the adjacent screen printing machines being adjacent to each other, the at least one shuttle conveyor each being configured to receive and pass the circuit substrate; and
   a controller,
   wherein:
   each of the plurality of screen printing machines comprises:
      a front conveyor including a substrate support device and provided in a front portion of the screen printing machine;
      a rear conveyor provided in a rear portion of the screen printing machine and configured to allow passage of the circuit substrate; and
      a printing device configured to carry out the screen printing on the circuit substrate supported by the substrate support device,
   each of the at least one shuttle conveyor includes:
      a movable conveyor that is movable at least between a first position continuous to at least one of the front conveyors of the adjacent screen printing machines and a second position continuous to at least one of the rear conveyors of the adjacent screen printing machines, and
      a conveyor-width changing device that includes a width-changing motor, a belt and a plurality of pulleys that cause the movable conveyor to move to change a conveyor width of the movable conveyor, and
   the controller is configured to control the movable conveyor to change the conveyor width of the movable conveyor at least one of (a) during a movement of the movable conveyor to one of the first position and the second position, and (b) before a start of the movement of the movable conveyor, when at least two of the plurality of screen machines respectively carry out the screen printing in parallel on circuit substrates having different convey widths from each other.

2. The screen printing line according to claim 1, wherein the plurality of screen printing machines are two screen printing machines.

3. The screen printing line according to claim 1, wherein each of the at least one shuttle conveyor has a configuration capable of moving the movable conveyor to a more forward position than a position at which the circuit substrate is passed and received between the movable conveyor and the at least one of the front conveyors.

4. A screen printing line, comprising:
a plurality of screen printing machines arranged in a right and left direction and each configured to carry out screen printing on a circuit substrate;
a plurality of shuttle conveyors each configured to convey the circuit substrate and each placed on one of upstream and downstream sides of any of the plurality of screen printing machines; and
a controller,
wherein:
each of the plurality of screen printing machines comprises:
a main body;
a front conveyor including a substrate support device and provided in a front portion of the main body;
a rear conveyor provided in a rear portion of the main body and configured to allow passage of the circuit substrate; and
a printing device configured to carry out the screen printing on the circuit substrate supported by the substrate support device,
each of the plurality of shuttle conveyors includes:
a movable conveyor that is movable at least between a first position continuous to the front conveyor of a corresponding one of the plurality of screen printing machines and a second position continuous to the rear conveyor of the corresponding one of the plurality of screen printing machines, and
a conveyor-width changing device that includes a width-changing motor, a belt and a plurality of pulleys that cause the movable conveyor to move to change a conveyor width of the movable conveyor,
at least one of: one of the plurality of screen printing machines; and
one of the plurality of shuttle conveyors comprises a substrate identification device configured to identify at least a type of the circuit substrate, and the screen printing line comprises an operating-manner determining portion configured to, based on a result of the identification of the substrate identification device, determine an operating manner of at least one of the screen printing machines and the shuttle conveyors, and
the controller is configured to control the movable conveyor to change the conveyor width of the movable conveyor at least one of (a) during a movement of the movable conveyor to one of the first position and the second position, and (b) before a start of the movement of the movable conveyor, when at least two of the plurality of screen machines respectively carry out the screen printing in parallel on circuit substrates having different convey widths from each other.

5. The screen printing line according to claim 4,
wherein:
the screen printing line comprises:
a plurality of control computers, as the controller, configured to respectively control the plurality of screen printing machines; and
a host computer connected to the control computers,
the substrate identification device is provided in each of the plurality of shuttle conveyors and connected to the host computer, and
the host computer comprises the operating-manner determining portion and is configured to command the control computers to operate the screen printing machines in the operating manner determined by the operating-manner determining portion.

6. The screen printing line according to claim 4,
wherein the substrate identification device is provided in each of the plurality of shuttle conveyors, the plurality of shuttle conveyors each being placed on an upstream side of any of the plurality of screen printing machines, and
wherein the operating-manner determining portion is configured to, based on the result of the identification of each of the substrate identification devices, determine whether each of the movable conveyors is to be moved to a position continuous to the front conveyor of a corresponding one of the screen printing machines which is disposed downstream of the movable conveyor, or a position continuous to the rear conveyor of the corresponding one of the screen printing machines which is disposed downstream of the movable conveyor.

7. The screen printing line according to claim 4,
wherein:
the screen printing line comprises:
a plurality of control computers, as the controller, configured to respectively control the plurality of screen printing machines,
the substrate identification device is provided in the front conveyor of each of the plurality of screen printing machines, and
the operating-manner determining portion is provided in each of the plurality of control computers and configured to determine whether the screen printing machine corresponding to the control computer is to carry out the printing on the circuit substrate identified by the substrate identification device.

8. A screen printing method performed by a screen printing line, the screen printing line comprising: two screen printing machines arranged in a right and left direction and each configured to carry out screen printing on a circuit substrate; and a shuttle conveyor provided between the two screen printing machines to receive and pass the circuit substrate,
wherein:
each of the two screen printing machines comprises: a front conveyor including a substrate support device and provided in a front portion of the screen printing machine; a rear conveyor provided in a rear portion of the screen printing machine and configured to allow passage of the circuit substrate; and a printing device configured to carry out the screen printing on the circuit substrate supported by the substrate support device,
the shuttle conveyor includes:
a movable conveyor that is movable at least between a first position continuous to at least one of the front conveyors of the two screen printing machines and a second position continuous to at least one of the rear conveyors of the two screen printing machines, and a conveyor-width changing device that includes a width-changing motor, a belt and a plurality of pulleys that cause the movable conveyor to move to change a conveyor width of the movable conveyor, and the screen printing method comprises:

mounting masks respectively on the two screen printing machines, the masks being different from each other; and having the two screen printing machines respectively carry out the printing in parallel on circuit substrates having different convey widths from each other, and changing the conveyor width of the movable conveyor at least one of (a) during a movement of the movable conveyor to one of the first position and the second position, and (b) before a start of the movement of the movable conveyor.

9. A screen printing method performed by a screen printing line, the screen printing line comprising: three screen printing machines arranged in a right and left direction and each configured to carry out screen printing on a circuit substrate; and two shuttle conveyors each provided between any pair of adjacent screen printing machines of the three screen printing machines to receive and pass the circuit substrate, the adjacent screen printing machines being adjacent to each other, wherein:

each of the three screen printing machines comprises: a front conveyor including a substrate support device and provided in a front portion of the screen printing machine; a rear conveyor provided in a rear portion of the screen printing machine and configured to allow passage of the circuit substrate; and a printing device configured to carry out the screen printing on the circuit substrate supported by the substrate support device, each of the two shuttle conveyors includes:

a movable conveyor that is movable at least between a first position continuous to at least one of the front conveyors of the adjacent screen printing machines and a second position continuous to at least one of the rear conveyors of the adjacent screen printing machines, and a conveyor-width changing device that includes a width-changing motor, a belt and a plurality of pulleys that cause the movable conveyor to move to change a conveyor width of the movable conveyor, and wherein the screen printing method comprises:

mounting masks respectively on the three screen printing machines, the masks being different from one another;

having the three screen printing machines respectively carry out the printing in parallel on three types of circuit substrates having different convey widths from one another, and changing the conveyor width of the moveable conveyor at least one of (a) during a movement of the movable conveyor to one of the first position and the second position, and (b) before a start of the movement of the movable conveyor.

* * * * *